(12) United States Patent
Sato et al.

(10) Patent No.: US 6,180,497 B1
(45) Date of Patent: Jan. 30, 2001

(54) METHOD FOR PRODUCING SEMICONDUCTOR BASE MEMBERS

(75) Inventors: Nobuhiko Sato, Sagamihara; Satoshi Matsumura, Atsugi, both of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/357,977

(22) Filed: Jul. 21, 1999

(30) Foreign Application Priority Data

Jul. 23, 1998 (JP) .................................................. 10-207933

(51) Int. Cl.$^7$ .............................. H01L 21/30; H01L 21/46
(52) U.S. Cl. .......................... 438/458; 438/479; 438/964
(58) Field of Search .................................. 438/406, 455, 438/459, 458, 964, 479; 117/43

(56) References Cited

U.S. PATENT DOCUMENTS

| | | | |
|---|---|---|---|
| 5,371,037 | 12/1994 | Yonehara ................................. | 437/86 |
| 5,856,229 | 1/1999 | Sakaguchi et al. ................... | 438/406 |
| 5,869,387 | 2/1999 | Sato et al. .............................. | 438/459 |
| 6,100,166 | * 8/2000 | Sakaguchi et al. ................... | 438/435 |

FOREIGN PATENT DOCUMENTS

| | | |
|---|---|---|
| 5-021338 | 1/1993 | (JP) . |
| 9-102594 | 4/1997 | (JP) . |

OTHER PUBLICATIONS

Nobuhiko Sato et al.; Epitaxial Growth on Porous Si for a New Bond and Etchback Silicon–on–Insulator; J. Electrochem. Soc., vol. 142, No. 9, Sep. 1995, The Electrochemical Society, Inc.

Applied Physics Letters; G.S. Higashi et al.; Comparison of Si(111) Surfaces Prepared Using Aqueous Solutions of NH$_4$F Versus HF; vol. 58, No. 15, Apr. 15, 1991, pp. 1656–1658.

S. Verhaverbeke; "The Effect of H$_2$ Annealing on the SI Surface, and its Use in the Study of Roughening During Wet Chemical Cleaning"; 1994, vol. 94–10, pp. 1170–1181, Proceedings of the Seventh International Symposium on Silicon Materials Science and Technology, Semiconductor Silicon/1994, The Electrochemical Society, Inc. (Pennington, NJ 1994).

Journal of the Electrochemical Society; R. Herino et al.; "Porosity and Pore Size Distributions of Porous Silicon Layers"; Aug. 1987, vol. 134, No. 8A, pp. 1994–2000.

Applied Physics Letters; T. Yonehara et al.; "Epitaxial Layer Transfer by Bond and Etch Back of Porous Si"; vol. 64, No. 16, Apr. 18, 1994, pp. 2108–2110.

Extended Abstracts (The 42$^{nd}$ Spring Meeting, 1995); The Japan Society of Applied Physics and Related Societies; Mar. 28, 1995; No. 2, p.602, 19p–ZB–8.

Extended Abstracts (The 55$^{th}$ Autumn Meeting, 1994); The Japan Society of Applied Physics; Sep. 19, 1994; No. 2, p. 762, 29a–PA–11.

\* cited by examiner

*Primary Examiner*—Charles Bowers
*Assistant Examiner*—Asok Unmar Sarkar
(74) *Attorney, Agent, or Firm*—Fitzpatrick, Cella, Harper & Scinto

(57) ABSTRACT

A method of producing a semiconductor base member that can be used as a Silicon on Insulator (SOI) wafer is presented. To produce an SOI wafer, it is necessary to prepare a base member having a porous layer upon which a non porous layer is formed. To make the pore size distribution of a porous layer uniform, a surface comprising atom steps and terraces is formed on the surface of a silicon base material and made porous without eliminating the steps and terraces, and then a nonporous semiconductor single-crystal film is formed thereon.

39 Claims, 9 Drawing Sheets

METHOD FOR PRODUCING SEMICONDUCTOR BASE MEMBERS

BACKGROUND OF THE INVENTION

1. Field of the Invention

The present invention relates to a method of producing a semiconductor base member having a nonporous layer formed on a porous layer and a method of using this semiconductor base member to produce a semiconductor member such as an SOI wafer.

2. Related Background Art

In order to manufacture a light emitting element or an SOI wafer, it is necessary to prepare a semiconductor base member having a porous layer and a nonporous layer formed thereon.

An example of preparation of the semiconductor base member will be described with reference to FIGS. 9A to 9F.

As shown in FIG. 9A, a silicon base material 1 such as a CZ silicon wafer having a polished surface is prepared and at least its surface is made porous by anodization or the like.

After the inner wall surfaces of pores in a porous layer 2 are oxidized, the silicon base material is cleaned with a dilute hydrofluoric acid to remove an oxide film from the surface of the porous layer 2.

As shown in FIG. 9B, the porous layer 2 is subjected to a heat treatment in a hydrogen-containing atmosphere, and a silicon-containing gas is then introduced to epitaxially grow a nonporous layer 3.

As shown in FIG. 9C, the surface of the nonporous layer 3 is oxidized to form an insulating film 4.

As shown in FIG. 9D, a first member comprising a silicon base material 1 having the porous layer 2, the nonporous layer 3, and the insulating layer 4 is bonded to a second member 5 separately prepared to form a multilayer structure having the nonporous layer 3 inside.

As shown in FIG. 9E, the silicon base material 1 is removed. The method for removing the silicon base material 1 includes a method of eliminating the silicon base material 1 itself by grinding, polishing, or etching from the back surface and a method of cracking the inside of the porous layer 2 and/or its interface to separate and remove the silicon base material 1.

As shown in FIG. 9F, the porous layer 2 remaining on the surface of the second member 5 is removed to obtain an SOI wafer having the nonporous layer 3 formed on the second member 5 via the insulating layer 4.

The above method is disclosed in Japanese Patent Application Laid-Open No. 5-21338 (Japanese Patent No. 2608351), U.S. Pat. No. 5,371,037, U.S. Pat. No. 5,856,229, Japanese Patent Application Laid-Open No. 9-102594, and Appl. Phys. Lett. 64, 1994, p. 2108, and the like.

However, there is a demand for further improvement of the quality of the nonporous layer formed on the porous layer, in particular, surface smoothness and crystal defects.

For example, in the above method for producing an SOI wafer, when the surfaces to be bonded are not smooth, a void, that is, a non-bonded area which is observed by ultrasonic waves or infrared transmitted light is easily generated in bonding.

In addition, in producing a device such as an MOS transistor using the nonporous layer, metal impurities may be conventionally segregated into crystal-defect sites. When metal impurities are segregated into crystal-defect sites, the device characteristics is easily degraded.

SUMMARY OF THE INVENTION

An object of the present invention is to provide a method for producing a semiconductor base member which can improve the surface quality of a thin nonporous film formed on a porous layer to reduce the crystal defect density.

Another object of the present invention is to provide a method for producing a semiconductor base member which can make the pore size distribution of the porous layer uniform to efficiently seal the pores in the surface of the porous layer and at the same time improve the surface smoothness and which can reduce the crystal defect density in the nonporous film formed on the porous layer.

This invention is characterized in that a surface comprising atom steps and atom terraces is formed on a silicon base material and then made porous, followed by the formation of a nonporous film.

DETAILED DESCRIPTION OF THE PREFERRED EMBODIMENTS

FIGS. 1A to 1D are schematic views for showing the method for producing a semiconductor base member according to one embodiment of the present invention.

Figure 1A:
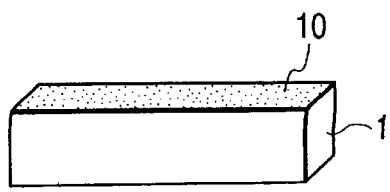
FIGS. 1A, 1B, 1C, and 1D are schematically perspective views for showing the method of producing a semiconductor base member according to one embodiment of the present invention.

As shown in FIG. 1A, a silicon base material 1 is prepared which has a surface 10 exhibiting a granular morphology. This base material is generally a commercially available silicon wafer.

Figure 1B:
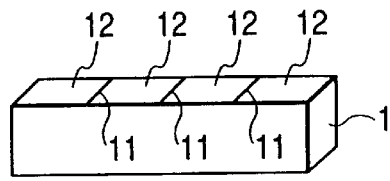

As shown in FIG. 1B, a surface of the silicon base material is treated by means of hydrogen annealing as described below to change the surface 10 exhibiting a granular morphology to a surface substantially comprising atom steps 11 and terraces 12.

Figure 1C:
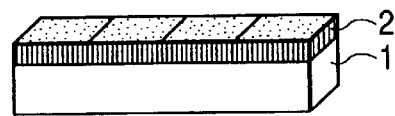

The surface comprising the steps 11 and the terraces 12 is made porous by means of anodization to form a porous layer 2 on at least the top surface of the silicon base material 1 as shown in FIG. 1C.

Figure 1D:
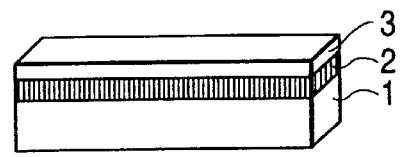

As shown in FIG. 1D, a nonporous layer 3 is formed on the surface of the porous layer 2 by means of CVD or the like.

Compared to the conventional method of making porous layer on a surface having no steps and terraces, the present invention can reduce the pore size distribution of the porous layer 2 to increase the crystallinity of the nonporous layer 3 formed on the porous layer. That is, the present invention can reduce the crystal defect density of stacking defects, dislocations, or twins that may be introduced into the nonporous layer 3.

The pore size of a pore in the surface of porous silicon can be evaluated by means of a gas adsorption method or observations using a high-resolution scanning electron microscope (HRSEM).

The measurement method using the gas adsorption method is disclosed in, for example, R. Herino et al. J. Electrochem. Soc., vol. 134, p. 1994 (1987). On the other hand, in the HRSEM method, obtained HRSEM images are processed to calculate the pore size distribution.

In this case, the brightness and contrast of the SEM images must be prevented from varying among the photographs.

Observations using an atomic force microscope indicate the surface of a commercially available silicon wafer prepared as the silicon base material 1 exhibits a granular morphology, as schematically shown in FIG. 1A. The commercially available silicon wafer is finished by chemically mechanically polishing (CMP) a surface obtained by means of grinding and sufficiently cleaning it.

Figure 2:
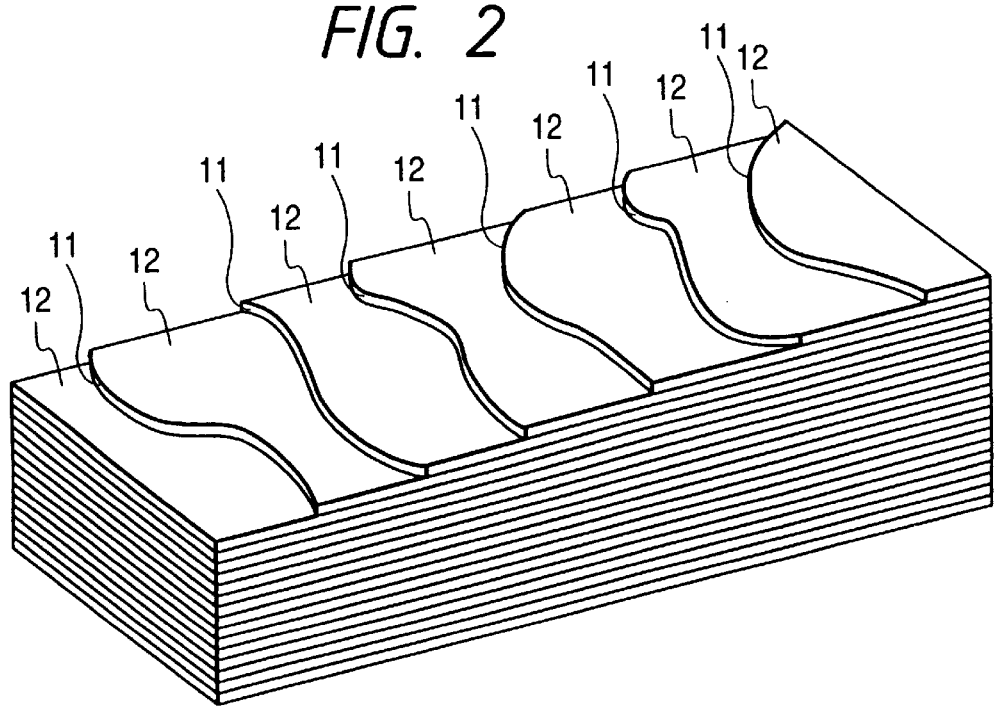
FIG. 2 is a schematically enlarged perspective view for showing the step-terrace structure of the surface of a silicon base material according to the present invention.

On the other hand, instead of the granular morphology, a striped morphology is observed in both a surface obtained immediately after hydrogen annealing (AS ANNEAL) and a surface obtained immediately after the epitaxial growth (AS EPI) of a single-crystal layer on the surface of the silicon base material, as typically shown in FIG. 1B. This striped morphology is formed of a step-shaped surface and differences in height between these steps correspond to the lattice distances of silicon. In addition, the step cycle increases or decreases depending on the offset of a face orientation from a low-order face. If a silicon surface of a face orientation (100) is hydrogen-annealed, a step-terrace structure comprising a (2×1) reconfigured surface and a (1×2) reconfigured surface, that is, a face comprising atom steps and terraces is observed. An atomic force microscope shows that the surface roughness of the exposed surface of such a step-terrace structure is better than that of the commercially available wafer. For example, while a commercially available wafer exhibits a mean square roughness of 0.13 nm in a 1 $\mu$m×1 $\mu$m area of its surface, the step-terrace structure has a mean square roughness of 0.09 nm under the same conditions. The method for forming such a step-terrace structure is not limited to the one described above, but cleaning with a special chemical or gas etching can be used under appropriate conditions to form the structure. FIG. 2 shows schematically enlarged view of a step terrace structure.

The step 11 may be shaped like a straight line, a circular arc, a vortex, or a curve as schematically shown in FIG. 2.

The step-terrace structure is disclosed in, for example, "The effect of $H_2$ Annealing on the Si surface and its use in the study of roughening during wet chemical cleaning," Proc of the 7th Int. Symposium on Silicon Materials Science Technology (The Electrochemical Society, 1994), pp.1170–1181. This shows the formation of the step-terrace structure by means of hydrogen annealing prior to epitaxial growth.

Many of steps or terraces, however, is eliminated by cleaning after hydrogen annealing or epitaxial growth. In general, silicon wafers used to manufacture LSIs are carefully cleaned using various chemicals as in RCA cleaning, thereby removing particles attached to the surface of the wafer, removing organic substances or oxides, or preventing metal contamination.

In particular, cleaning with an aqueous solution containing ammonia and hydrogen peroxide, which is called SC-1 or APM, is important in eliminating metal contamination. This cleaning is carried out by removing foreign matter while etching silicon. Thus, after cleaning for long time or cleaning with highly ammonia concentration solution, the surface of the silicon wafer has been etched by more than 20 nm easily.

Commercially available CZ wafers or hydrogen-annealed CZ wafers all exhibit a granular morphology.

Figure 3A:
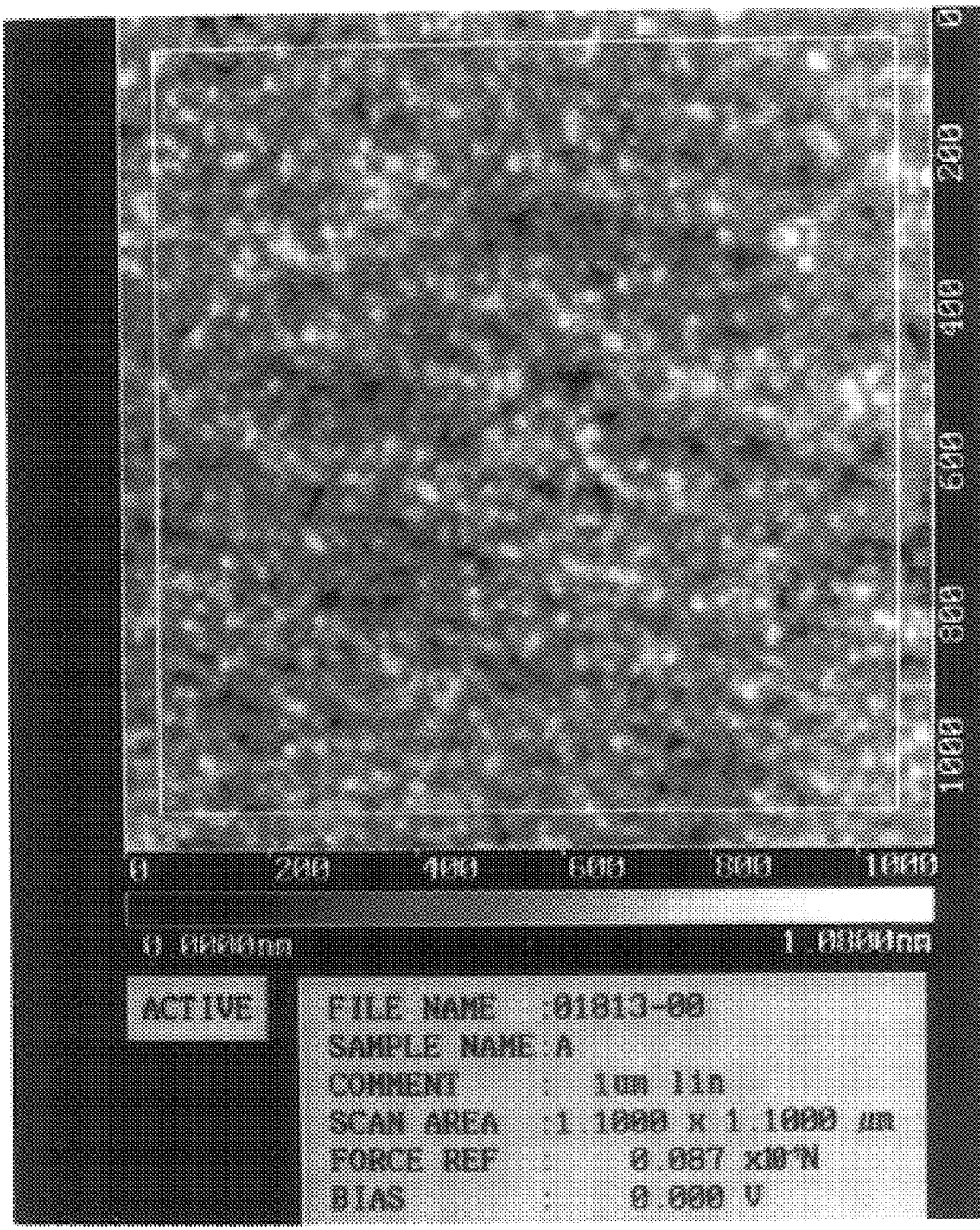
FIGS. 3A and 3B are photographs of a wafer surface with an atomic force microscope (AFM)

FIG. 3A is a photograph of a wafer surface exhibiting such a granular morphology, which has been taken using an atomic force microscope (AFM).

On the other hand, both a CZ wafer immediately after hydrogen annealing and a wafer immediately after epitaxial growth exhibit a striped morphology.

Figure 3B:
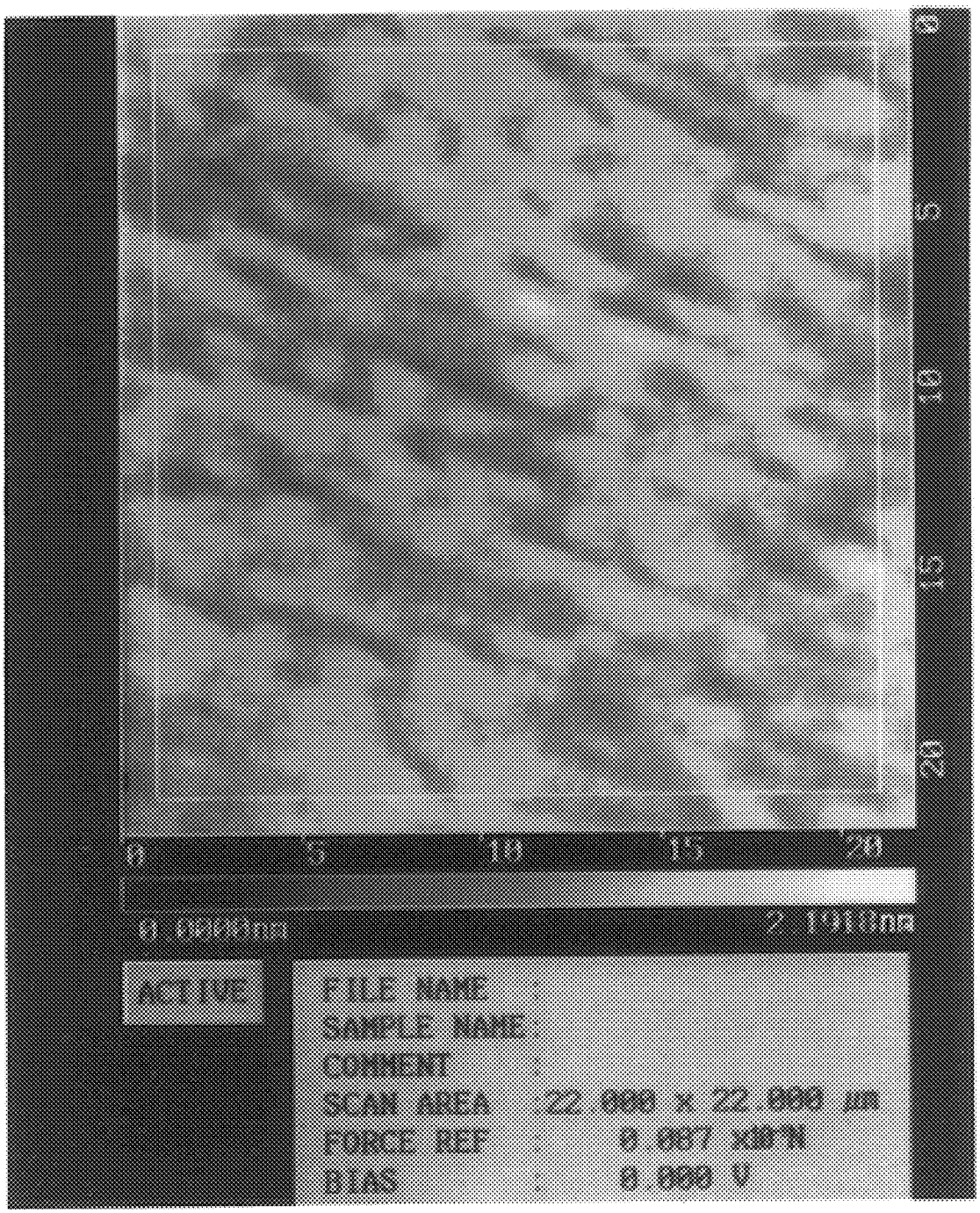

FIG. 3B is a photograph of a wafer surface exhibiting such a striped morphology, which has been taken using the atomic force microscope (AFM).

When a wafer exhibiting the morphology shown in FIG. 3B is subjected to a cleaning treatment to be etched by more than 20 nm, it exhibits the morphology shown in FIG. 3A.

In addition, the amount of etched silicon increases in a linear-function manner with the actual cleaning time during the SC-1 cleaning, that is, the time during which the wafer remains immersed in the aqueous solution of ammonia and hydrogen peroxide. Although this etching amount also depends on other conditions such as the temperature and the concentration of ammonia/hydrogen peroxide, reduction of the etching amount is controlled to approximately 20 nm or less, more preferably, 10 nm or less, whereby a surface comprising atom steps and terraces which is suited to be made porous can be maintained. This tendency applies to cleaning methods other than the SC-1 cleaning as long as a cleaning liquid providing an etching effect is used.

As described above, in the present invention, it is important to, after formation of a surface comprising atom steps and terraces, carry out a treatment for forming a porous structure while the step-terrace structure is maintained without eliminating it by cleaning.

For example, when cleaning is executed for about 10 minutes using a mixture of aqueous ammonia and hydrogen peroxide at 80° C., the amount of etched silicon is about 4 nm and the step-terrace structure can be prevented from being eliminated unless this cleaning is repeated 5 times or more.

Next, an example of chemical cleaning treatment, which is one of the methods for forming a surface comprising atom steps and terraces, will be described.

A silicon wafer of a face orientation (111) or a silicon wafer (an off substrate) having a surface with a face orientation inclined at 0 to 4° from the face orientation (111) is prepared. The wafer is treated for about 30 seconds or more with 1 mol/liter solution of potassium hydroxide (KOH) (Extended abstracts for the Applied Physics Society, Autumn 1994, vol. 2, p. 762, 29a-PA-11). Alternatively, the wafer is treated with ammonium fluoride as described in G. S. Higashi et al., Appl. Phys. Lett. 58, (1991) p.1656. These treatments enable a surface comprising atom steps and terraces to be exposed.

Another method comprises oxidizing a surface of a silicon wafer of a face orientation (100) and then removing the oxide film formed with an aqueous solution of hydrogen fluoride (HF) and hydrogen chloride (HCl) (Extended abstracts for the Applied Physics Society, Spring, 1995, vol. 2, p. 602, 19p-ZB-8). Yet another method comprises a treatment with an aqueous solution of HF and hydrogen peroxide.

In each of these methods, steps and terraces should be carefully prevented from being eliminated by controlling cleaning conditions after the formation of surface comprising the steps and terraces.

When a surface comprising steps and terraces is to be formed by means of heat treatment, oxygen near a surface of a substrate can be diffused to the exterior to reduce the concentration of oxygen. Certain heat treatment can eliminate oxygen deposits present near a surface of a CZ silicon wafer substrate. The oxygen deposits are removed by means of etching with HF used for anodization, and therefore pores in the porous silicon may be enlarged. The heat treatment can prevent such local enlargement of the pores. In particular, heat treatment in a hydrogen atmosphere or an inert gas atmosphere containing, for example, argon can reduce the concentration of oxygen and the density of oxygen deposits and is preferably used for the present invention. The heat treatment in hydrogen is typically carried out with 100% hydrogen at 1200° C. for 1 hour. Similar effects can be obtained even at about 1100° C.

In addition, when a surface comprising steps and terraces is formed by means of epitaxial growth, the concentration of oxygen in an epitaxial silicon layer can be reduced down to the order of $10^{17}$ cm$^{-3}$ by controlling the amount of oxygen and moisture remaining in the furnace during epitaxial growth. The concentration of oxygen in a CZ silicon wafer is on the order of $10^{18}$ cm$^{-3}$. These concentrations of oxygen can be measured using SIMS (secondary ion mass spectrometry).

When the heat treatment in hydrogen is used to form as a substrate surface a surface comprising steps and terraces, external diffusion during the treatment reduces the concentration of impurities such as boron and phosphorus near the surface. Since, however, the epitaxial growth can generate a surface comprising steps and terraces at a lower temperature than the heat treatment, it is unlikely to be subjected to the decrease in the concentration of impurities and enables the formation of the step-terrace structure to be controlled independently of the control of the concentration of impurities. That is, the epitaxial growth method provides a high controllability.

When the epitaxially grown layer is not thick, the impurities added to this layer are not particularly added during the epitaxial growth but may be diffused from the substrate by means of heat treatment during or after the epitaxial growth.

FIGS. 4A to 4I are schematic views for showing a method for producing a semiconductor base member according to another embodiment of the present invention.

Figure 4A:
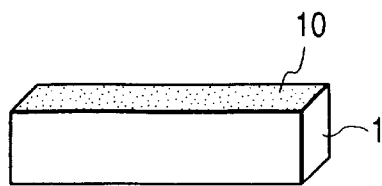
FIGS. 4A, 4B, 4C, 4D, 4E, 4F, 4G, 4H and 4I are schematically perspective views for showing the method of producing a semiconductor base member according to another embodiment of the present invention.
Figure 4B:
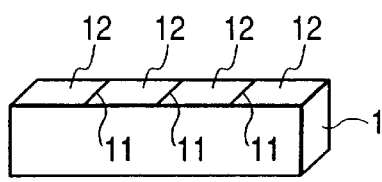

As shown in FIG. 4A, a silicon base material 1 is prepared, and as shown in FIG. 4B, a surface treatment is executed so as to form a surface comprising steps 11 and terraces 12.

Figure 4C:
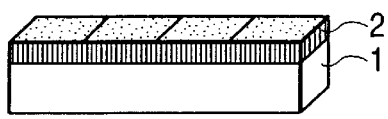

As shown in FIG. 4C, the surface comprising the steps 11 and the terraces 12 is made porous to form a porous layer 2.

Figure 4D:
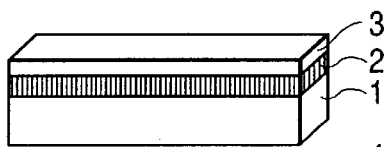

As shown in FIG. 4D, a nonporous layer 3 is formed on the surface of the porous layer 2 by means of CVD or the like to obtain a first member.

Figure 4E:
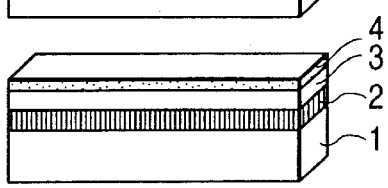

As shown in FIG. 4E, an insulating layer 4 is formed as required.

Figure 4F:
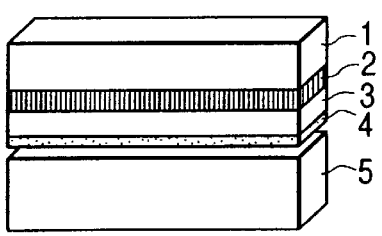

As shown in FIG. 4F, a second member 5 is prepared separately from the first member having the porous layer 2 and the nonporous layer 3.

Figure 4G:
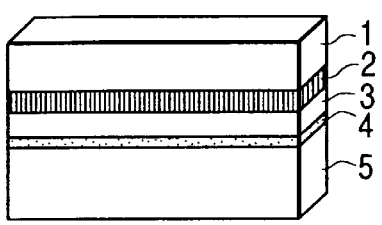

As shown in FIG. 4G, the first member and the second member 5 are bonded together so as to obtain a multilayer structure having the nonporous layer 3 disposed inside.

Figure 4H:
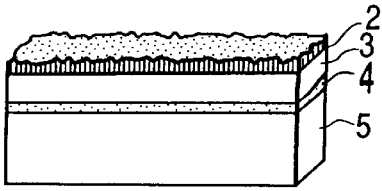

Subsequently, unnecessary portions such as the porous layer 2 and the like are removed from the multilayer structure to produce a semiconductor base member having the nonporous layer 3 on the second member 5. As shown in FIG. 4H, the silicon base material 1 not made porous is removed by means of grinding, polishing or etching as described later in details. The method for removing the silicon member 1 may comprise separating the multilayer structure into two by the porous layer 2.

Figure 4I:
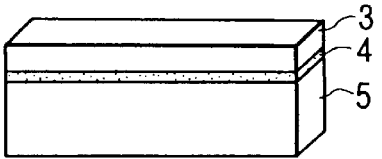

Next, as shown in FIG. 4I, the residual porous layer 2 is removed by means of etching, hydrogen annealing or the like.

Thus, a semiconductor base member preferred for an SOI wafer can be obtained.

[Effects of COP (crystal originated particle) on the formation of a porous layer]

Recent studies show that COPs exist on the surface of a commercially available CZ silicon wafer that has been polished and cleaned. COPs are formed by introducing regular-octahedron-shaped cavities into a bulk silicon when a silicon ingot is produced by drawing silicon out from a melt based on the Czochralski method and manifesting as depressions due to polishing or cleaning after exposure from the surface, and they are detected by a commercially available foreign matter inspection apparatus. The size of COPs are from 100 to 300 nm, and the number of COPs existing on the surface is 2 to $4 \times 10^5$/cm$^3$. On the other hand, pores of approximately 10 nm are arranged in a porous silicon on a degenerate substrate at an interval of about 20 nm. That is, one COP covers approximately 10 pores in the porous silicon.

The COP manifests on the wafer surface as a depression. On the other hand, when the top of the regular octahedron of the COP is exposed form the surface, the COP appears like a pore in the porous silicon and is mistakenly observed as a large pore. In addition, even when the COP is not exposed from the surface, the cavity of the COP affects the anodization current density and thus the pore size and distribution. Furthermore, in case of the embedded COP portion, in the step of thermally treating the wafer in a reducing atmosphere containing hydrogen after anodization to seal the pores, silicon atoms move so as to reduce the surface energy of the inner surfaces of the regular octahedron of the COP, and as a result, the surface immediately above the COP is sunk so that the pores is not sealed in some cases. When a result, when a nonporous single-crystal silicon layer is epitaxially grown thereon, defects may be introduced into this layer.

[Formation of a surface layer free from COPs]

The above problem can be solved by depositing an epitaxial silicon layer on a silicon wafer with COPs to form a surface layer free from COPs and then forming a porous silicon layer thereon. The epitaxial silicon layer may be grown by means of the CVD method using a commercially available epitaxial growth apparatus, and a source gas is not limited to $SiCl_4$, $SiHCl_3$, $SiH_2Cl_2$, and $SiH_4$. In addition, a carrier gas is not particularly limited but is preferably hydrogen. In addition, this layer may be grown at a low temperature using ultra-high-vacuum CVD (UHV-CVD) or in a batch heat treatment furnace in which wafers are arranged on a boat, a source gas may be supplied using hydrogen or nitrogen as a carrier gas.

Although the film thickness of the epitaxial silicon layer is not particularly limited, it is desirably larger than 100 to 300 nm, which is equal to the size of the COP.

In the case of forming a porous silicon used for a method for producing a semiconductor base member by bonding, the concentration of impurities in the surface layer is desirably in a degenerate state ($p^+$ or $n^+$). The structure of a porous layer formed on a degenerate semiconductor significantly differs from the structure of a porous layer formed on a non-degenerate semiconductor. The former porous layer has a pore size from about 10 nm to about 50 nm and a pore density from $10^{10}/cm^2$ to $10^{11}/cm^2$, while the latter porous layer has a structure obtained by proportionally contracting the former porous layer so that its pore size is from 2 nm to 10 nm. Thus, the latter porous layer has a smaller pore wall thickness and a lower mechanical strength. When the porous layers are formed under the same conditions, the porous layer formed on the non-degenerate substrate tends to have a higher porosity. Thus, during the process, the porous layer may be collapsed or the crystallinity of the epitaxial silicon layer formed on the porous layer may be degraded.

The addition of impurities may be executed by using a $p^+$ or $n^+$ substrate as the semiconductor base member for forming the epitaxial silicon layer thereon, growing the epitaxial silicon layer, and then increasing the concentration of the impurities in the epitaxial silicon layer by thermal diffusion. In addition, the epitaxial silicon layer may be doped with impurities while the epitaxial silicon layer is grown. In the latter case, an inexpensive dummy wafer can be selected for producing a semiconductor base member, thereby reducing manufacturing costs. Furthermore, by forming a high-concentration doped epitaxial silicon layer on a low-concentration substrate and then making porous the layer down to a depth larger than the thickness of the epitaxial silicon layer to form a porous silicon layer, a low-porosity layer is formed on the high-concentration doped epitaxial silicon layer while a high-porosity layer is formed on the low-concentration substrate. This configuration enables separation at the high-porosity layer.

According to the present invention, the concentration of elements (impurities) which are contained in the surface area of a silicon base material to be made porous and which can control the conductivity type is generally from $5.0 \times 10^{16}/cm^3$ to $5.0 \times 10^{20}/cm^3$, preferably from $1.0 \times 10^{17}/cm^3$ to $2.0 \times 10^{21}/cm^3$, more preferably from $5.0 \times 10^{17}/cm^3$ to $1.0 \times 10^{20}/cm^3$ in view of the porous structure formation step and the characteristics of the epitaxial film formed on the porous silicon layer.

The thickness of the epitaxial layer is preferably from 0.2 $\mu$m to 30 $\mu$m, more preferably from 0.2 $\mu$m to 15 $\mu$m.

The COP density can also be reduced by thermally treating a commercially available silicon wafer in a hydrogen containing reducing atmosphere. The hydrogen containing reducing atmosphere contains only hydrogen or is a mixed atmosphere containing hydrogen and a rare gas (He, Ne, Ar, Xe or the like). The heat treatment temperature is preferably from about 900° C. to about 1200° C. Although the pressure is not particularly limited, a preferable temperature region can be reduced by reducing the pressure.

The porous layer 2 used in the present invention can be formed by anodizing, for example, an Si base material in an HF solution. The porous layer has a sponge-like structure in which pores of diameter from about $10^{-1}$ nm to about $10^1$ nm are arranged at an interval from about $10^{-1}$ nm to about $10^1$ nm. The density is smaller than the single-crystal Si density of 2.33 $g/cm^3$. The density can be varied from 2.1 to 0.6 $g/cm^3$ by varying the concentration of the HF solution from 50% to 20%, varying the ratio of alcohol added to the HF solution, or varying the current density. In addition, by previously modulating the resistivity and electric conductivity type of a portion to be made porous, the porosity can be varied based on the modulated resistivity and the conductivity type. In the p type and under the same anodization conditions, the non-degenerate substrate ($p^-$ or $n^-$) has a smaller pore size but a larger pore density by about one order and thus a larger porosity than the degenerate substrate ($p^+$ or $n^+$). That is, the porosity can be controlled by varying these conditions, so the porosity control is not limited to one of these methods. The porous layer may have either a single layer structure or a stacked structure comprising layers of different porosities. By forming an epitaxial silicon layer of a degenerate concentration on a degenerate substrate, a low-porosity layer can be formed in the epitaxial silicon layer at the surface side while a high-porosity layer can be formed in the non-degenerate portion at the substrate side.

The nonporous layer used in the present invention may be preferably a single layer or stacked layers comprising at least one selected from single-crystal Si, polycrystal Si, amorphous Si and the like, as well as compound semiconductors such as GaAs, InP, GaAsP, GaAlAs, InAs, AlGaSb, InGaAs, ZnS, CdSe, CdTe, SiGe and SiC. The nonporous layer may have semiconductor devices such as FETs (Field Effect Transistors) formed therein in advance.

The formation of the nonporous layer on the porous layer may be executed by chemical vapor deposition (CVD) such as the reduced pressure CVD, plasma CVD, optical CVD, or MOCVD (Metal-Organic CVD), or sputtering (including bias sputtering), molecular-beam epitaxial growth, liquid-phase growth or the like.

According to the present invention, the porous layer may be thermally treated prior to the formation of the nonporous layer as required.

The heat treatment can be carried out in an oxidizing atmosphere in order to prevent changes in the pore structure of the porous layer or in a reducing atmosphere in order to positively change the pore structure.

Preferably, the former is executed by thermally treating the porous layer in an oxidizing atmosphere at 200° C.–700° C. to oxidize the inner wall surfaces of the pores in the porous layer and cover the pore walls with an oxide film.

Preferably, the latter is executed by thermally treating (hydrogen-baking) the porous layer in a hydrogen containing reducing atmosphere at 800° C.–1200° C. to seal at least some of the pores in the surface of the porous layer.

Furthermore, these two methods may be combined to execute the heat treatment in an oxidizing atmosphere in order to oxidize the inner wall surfaces of the pores, followed by the heat treatment in a hydrogen containing reducing atmosphere for sealing the pores in the surface of the porous layer. In this case, prior to the hydrogen baking, an HF solution is preferably used to remove the oxide film from the surface of the porous layer.

Sato et al. has reported the sealing of the pores in the surface by the heat treatment of porous silicon in hydrogen (N. Sato et al., J. Electrochem. Soc., 1995, Vol. 142, p. 3116). This phenomenon is considered to be the reconfiguration of the surface rather than etching. That is, an infinite number of recessed and projected portions exist on the surface of the porous layer, and a large number of faces of a face orientation with a higher degree larger than that of the crystal layer are exposed from this surface.

Consequently, the surface energy is high. The heat treatment in a hydrogen containing reducing atmosphere removes a naturally oxidized film from the surface due to, for example, the reduction of oxide, and the naturally oxidized film is not generated during the heat treatment by the reduction action. Accordingly, the energy barrier against the movement of surface Si atoms is lowered to allow surface Si atoms induced by heat energy to move, thereby forming a flat surface with a low surface energy. The conditions for this hydrogen baking may be the same as in the heat treatment for the surface treatment of the silicon base material. The pores can be effectively sealed by executing a heat treatment in which the surface of the porous silicon is opposed to a member comprising a material containing as a main component, silicon or silicon and carbon or nitrogen and not containing oxygen as a main component, thereby restraining the etching of the silicon. This member is, for example, silicon, silicon carbide, or silicon nitride.

That is, since this phenomenon is started by thermally treating a clean surface, when a thick naturally oxidized film has been formed on the surface, the sealing of the pores in the surface can be started earlier by removing the oxide film by means of etching with dilute hydrofluoric acid prior to the heat treatment.

The smooth single-crystal surface of the resulting porous layer with the pores therein sealed can be preferably used to produce not only a bonded SOI but also a semiconductor device.

The second member used in the present invention may be an insulator, a semiconductor, or a conductor.

Specifically, it is glass, quartz glass, sapphire, silicon, silicon carbide, aluminum, stainless steel, or resin. When an SOI substrate is to be produced, the second member is preferably quartz glass, sapphire, silicon, or silicon with an insulating film such as silicon oxide formed on its surface.

According to the present invention, when the first member having the porous layer and the nonporous layer and the second member are bonded together, the first and second members are bonded preferably via an insulating layer. In particular, preferably, an insulating film such as an oxide film is formed on the surface of the nonporous layer and the insulating film and the surface of the second member are closely contacted and bonded together.

In addition, the first and second members may be bonded together by applying an adhesive between them.

The bonding method includes a method of closely contacting together the first and second members which have been cleaned so as to exhibit a hydrophobic or hydrophilic property; and a method of bonding the first and second members with an adhesive and then hardening the adhesive. When insulating surfaces of silicon oxide are to be closely contacted and bonded together, the bonding is preferably carried out after nitrogen or oxygen ions are implanted onto at least one of the insulating surfaces.

Furthermore, after the first and second members are closely contacted together, heat treatment is preferably executed to increase the bonding strength.

The following two method are described below as representative methods of removing the porous layer from the multilayer structure to expose the nonporous layer, but this invention is not limited to these methods.

The first method comprises using grinding, polishing, or etching to remove the first member from the back surface to expose the porous layer. Subsequently, the porous layer is removed to expose the nonporous single-crystal silicon layer.

The second method comprises cracking the inside of the porous layer of a multilayer structure and/or the upper and lower interfaces of the porous layer to separate the multilayer structure. Specific methods include a method of applying a tensile force perpendicular to the bonded surface of the multilayer structure; a method of applying a force to the ends of the multilayer structure such that the first and second members are separated from each other; a method of applying a shearing stress to the bonded surface in the direction parallel with this surface (for example, moving the first and second members in opposite directions within a face parallel with the bonded surface or rotating the members in opposite circumferential directions); a method of pressurizing the bonded surface in the direction perpendicular to this surface; a method of applying a wave energy such as ultrasonic waves to the separation area; a method of inserting a peeling member (for example, a sharp blade like a knife) and/or a fluid into the separation area in the direction parallel with the bonded surface from a side of the multilayer structure; a method of utilizing the expanding energy of a substance infiltrated into the porous layer acting as the separation area; a method of bonding to the substrate the porous layer acting as the separation area and thermally oxidizing the substrate from its side to expand the volume of the porous layer, thereby executing the separation; and a method of using as the separation area a layer having microcavities formed by ion-implantation and heating this layer by laser irradiation, thereby executing the separation. A method of pulse-heating followed by the application of thermal stress or softening of the porous layer can also be used, but this invention is not limited to these methods. Alternatively, after the porous layer acting as the separation area has been bonded to the substrate, the substrate can be selectively etched from its side without cracking the substrate.

Of these methods, the separation using a fluid will be specifically described.

The flow of a fluid required for separation according to this invention can be implemented by injecting from a thin nozzle a pressurized fluid comprising a gas or liquid. To convert an injected flow into a high-speed and high-pressurization beam, the water jet method can be used which is introduced by "Water Jet," vol. 1, no. 1, p. 4. The water jet which can be used in the present invention can be obtained by jetting from a thin nozzle a pressurized water of 100 to 8000 $kgf/cm^2$ pressurized by a high-pressure pump. By using the water jet, it is possible to cut or process ceramics, metal, concrete, resin, rubber, or woods (an abrasive material is added to water when a material to be cut is hard) or to remove a paint film from a surface layer or to clean wash the surface of a member. The main effect of the conventional water jet is the removal of a part of the material. That is, the water jet cutting removes a cut portion from a main member, and the removal of a paint film and the cleaning of a member surface remove the unnecessary portions. When a fluid jet such as the water jet is used as a fluid flow formation method in the present invention, the multilayer structure can be separated from its side by aligning the separation area with the side of the bonded surface and injecting a fluid jet to this area. In this case, the fluid jet is first injected directly to the separation area exposed from the side of the multilayer structure as well as parts of the first and second members around the separation area. Then, the fluid jet breaks only the separation area having a low mechanical strength to separate the structure into two without damaging the first and second members. In addition, even if the separation area is not exposed but is covered with a thin layer for any reason, the fluid jet first removes or destroys the layer covering the separation area and then continuously removes the exposed separation area.

A fluid jet can be injected to a narrow gap (a recess) in the side of a multilayer structure comprising bonded wafers so as to push the bonded wafers away from each other and destroy the separation area having a fragile structure to separate the wafers, though this effect is not often used conventionally. Since the object of this method is not cutting or removal, cutting chips are not scarcely generated from the separation area, and the multilayer structure can be separated without using an abrasive material or damaging the separating surface even when the material of the separation area does not removed by the fluid jet. Thus, this effect is considered to be obtained by a kind of wedge action by the fluid without the action of cutting or polishing. Thus, this effect can be enhanced when there is a narrow recessed gap in the side of the bonded substrate and when the injection of the fluid jet applies a force in a direction in which the separation area is peeled off. To sufficiently provide this effect, the side of the bonded substrate is preferably shaped like a recess instead of a projection.

The porous layer exposed from the multilayer structure can be selectively removed by utilizing the low mechanical strength and very large surface area of the porous layer. The selective removal method includes a mechanical method using polishing or lapping, and a method of utilizing chemical etching with an etchant or chemical dry etching.

When the porous layer is to be selectively wet-etched with an etchant, the etchant may be a mixture of hydrofluoric acid of 49 wt. % HF and hydrogen peroxide solution of 30 wt. % $H_2O_2$; hydrofluoric acid; a mixture of hydrofluoric acid and alcohol; a mixture of hydrofluoric acid, alcohol and hydrogen peroxide solution; buffered hydrofluoric acid; a mixture of buffered hydrofluoric acid and alcohol; a mixture of buffered hydrofluoric acid and hydrogen peroxide solution; a mixture of buffered hydrofluoric acid, alcohol and hydrogen peroxide solution; or a mixture of hydrofluoric acid, nitric acid and acetic acid. The mixture of HF and $H_2O_2$ is preferred because in use of this mixture, the etching selection ratio of porous Si to nonporous Si is $10^5$ or more. A surfactant such as alcohol is preferably added to prevent the attachment of air bubbles.

[Formation of SOI structure]

Although the method for producing a semiconductor base member having an SOI structure according to the present invention is not particularly limited, the method is particularly preferably used in the method of executing the selective etching of porous silicon. In this case, prior to the formation of porous silicon, the step-terrace structure is formed on the surface of the silicon base material, and the porous layer is then formed, thereby improving the crystallinity and surface smoothness of the nonporous single-crystal semiconductor film formed on the porous layer.

First, the step-terrace structure is formed on the surface of the silicon base material 1 by means of hydrogen annealing.

Figure 5A:
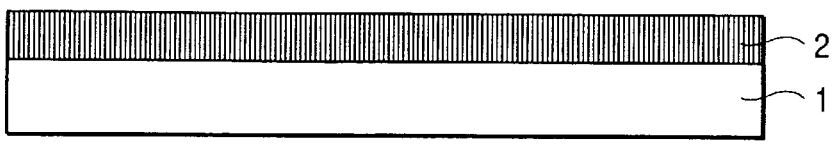
FIGS. 5A, 5B, 5C, 5D, 5E and 5F are schematically cross-sectional views for showing the method of producing a semiconductor base member according to the present invention.

Subsequently, the porous Si layer 2 is formed on at least the major surface (FIG. 5A). The porous Si layer can be formed by anodizing the Si base material in the HF solution.

The porous Si layer may have either a single layer structure or a stacked structure comprising layers of different porosities.

Figure 5B:
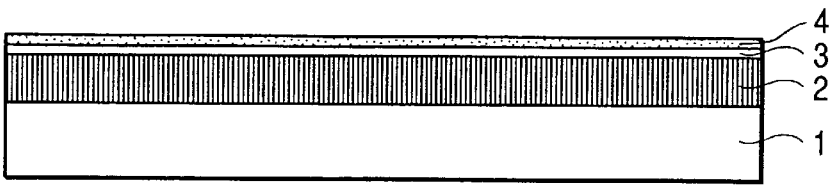
Figure 5C:
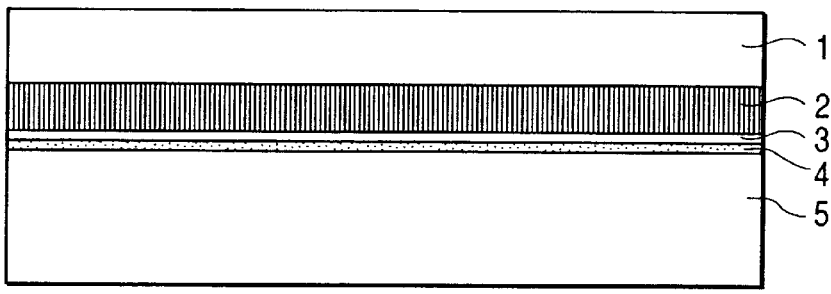

At least one nonporous single-crystal semiconductor layer 3 is formed on the porous layer 2 (FIG. 5B). The nonporous single-crystal semiconductor layer 3 is arbitrarily selected from a single-crystal Si layer formed by deposition and a layer obtained by making the surface layer of the porous layer 2 nonporous by hydrogen annealing. The nonporous single-crystal semiconductor layer 3 is desirably formed after the surface of the porous silicon layer has been thermally treated in a hydrogen containing reducing atmosphere to seal the pores in the porous surface. The pores can be effectively sealed by heat treatment in which the surface of the porous silicon is opposed to a material containing as a main component, silicon or silicon and carbon or nitrogen without containing oxygen as a main component, because the etching of the silicon is restrained. Furthermore, when the insulating layer 4 comprising silicon oxide is formed on the single-crystal Si layer by thermal oxidation, the interface between the single-crystal silicon layer and an embedded oxide film can be preferably formed by thermal oxidation so as to have a low interfacial level. The major surface of the semiconductor substrate having the nonporous single-crystal Si layer 3 formed thereon is closely contacted with a surface of the second member 5 comprising a silicon substrate at the room temperature, as shown in FIG. 5C. Prior to the close contact, surface cleaning is desirably carried out so as to remove attachments and foreign matter from the surface. The second member can be selected from an Si substrate, an Si substrate with a silicon oxide film formed thereon, a light transmitting substrate such as of quartz and sapphire but is not limited to them as long as its surface to be bonded is sufficiently flat and smooth. FIG. 5C shows the state that the second member and the silicon base material are bonded together via the insulating layer 4, but the insulating layer 4 can be omitted when the second member is not Si. The second member and the silicon base material may be bonded together via a thin insulating plate, whereby it is possible to form a three plates-stacked structure.

Figure 5D:
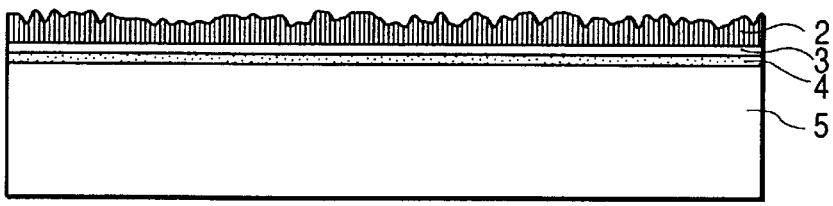
Figure 5E:
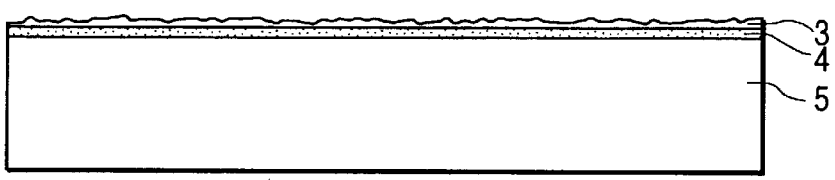

Subsequently, the porous layer 2 is removed to expose the nonporous single-crystal Si layer 3 (FIG. 5D).

In this case, the back surface of the silicon base material 1 is removed by grinding and the subsequent reactive ion etching to expose the porous layer 2. Subsequently, the porous layer 2 is removed to expose the nonporous single-crystal silicon layer 3.

The porous layer 2 is removed by selective etching with an etchant containing HF and $H_2O_2$. Then, the porous silicon can be removed by selective etching at a rate of $10^5$ times as large as that of the nonporous single-crystal silicon.

A surfactant may be added to this etchant in order to prevent the attachment of air bubbles. In particular, ethyl alcohol is preferably used.

Figure 5F:
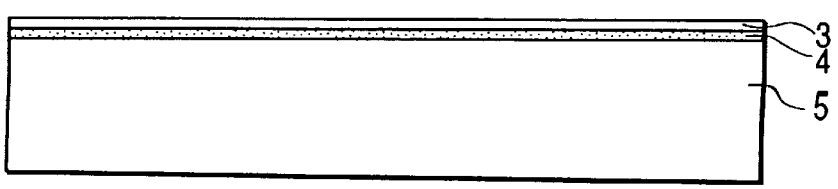

Subsequently, a heat treatment in a hydrogen containing reducing atmosphere is executed to reduce the boron concentration of the single-crystal silicon layer and flatten its surface (FIG. 5F). When the region of a high boron concentration in the single-crystal silicon layer is limited to the vicinity of the surface or when the reduction of the boron concentration is not required, then polishing may be used to remove the surface layer in order to smooth the surface.

FIG. 5F shows the semiconductor base member obtained. The flat and uniformly thin single-crystal Si film 3 having a large area over the entire wafer is formed on the second member 5 via the insulating layer 4. The semiconductor base member obtained in this manner can be preferably used to produce isolated electronic devices.

Next, a method for producing another semiconductor base member will be described with reference to FIGS. 6A to 6H.

Figure 6A:
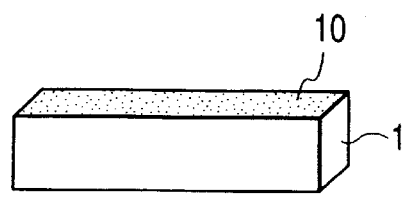
FIGS. 6A, 6B, 6C, 6D, 6E, 6F, 6G and 6H are schematically perspective views for showing the method of producing a semiconductor base member according to the present invention.

As shown in FIG. 6A, a silicon base material with a surface 10 having no step-terrace structure is prepared.

Figure 6B:
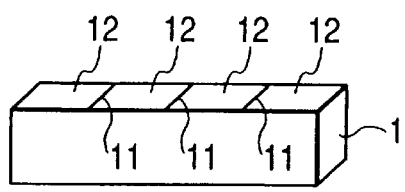

As shown in FIG. 6B, the surface of the step-terrace structure having steps 11 and terraces 12 is formed on the silicon base material 1 by hydrogen annealing.

Figure 6C:
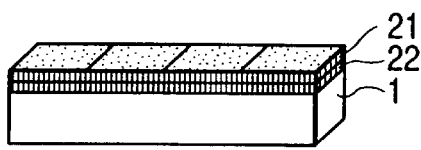

Subsequently, porous layers 21 and 22 are formed on the hydrogen-annealed surface (FIG. 6C). The porous Si layers can be formed by anodizing the Si base material in an HF solution.

For example, the current density can be varied to increase the pore density by about one order but decrease the pore size, thereby obtaining high porosity. That is, it is possible to form the high-porosity layer 22 and the low-porosity layer 21 located near an epitaxial silicon layer.

Figure 6D:
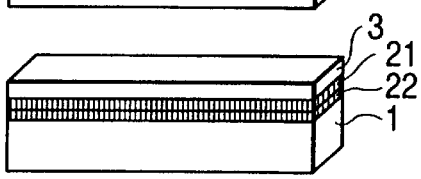
Figure 6E:
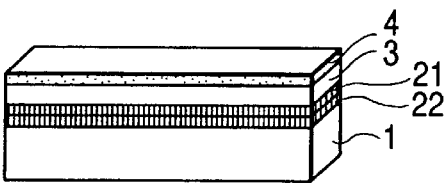

At least one nonporous single-crystal semiconductor layer 3 is formed on the porous layer 21 of a low porosity (FIG. 6D). The nonporous single-crystal semiconductor layer 3 is arbitrarily obtained by forming a single-crystal Si layer by deposition or by making the surface layer of the porous layer 21 nonporous. The formation of the nonporous single-crystal semiconductor layer 3 is desirably carried out after the surface of the porous silicon layer 21 has been thermally treated in a hydrogen containing reducing atmosphere to seal the pores in the porous surface. The pores can be effectively sealed by executing a heat treatment in which the surface of porous silicon is opposed to a member comprising a material such as silicon, SiC or SiN to thereby restrain the etching of silicon. Furthermore, as shown in FIG. 6E, an insulating layer 4 comprising silicon oxide is formed on the single-crystal Si layer by thermal oxidation.

Figure 6F:
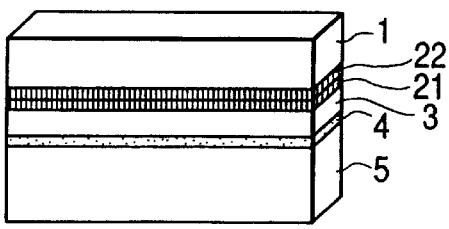

As shown in FIG. 6F, the nonporous single-crystal Si layer is closely contacted with the surface of the second member 5 at the room temperature. Prior to the contact, the Si layer and the second member are desirably cleaned to remove attachments and foreign matter from the surfaces.

FIG. 6F shows the nonporous Si layer bonded to the second member.

Figure 6G:
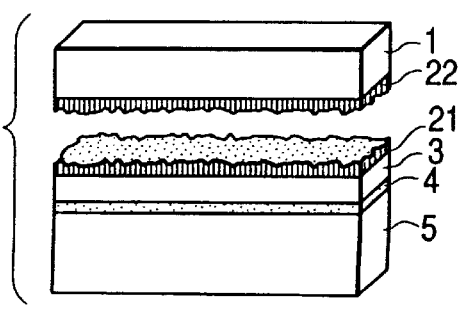

As shown in FIG. 6G, the multilayer structure is separated at the porous layer. As described above, the separation method includes a method of applying an external pressure such as pressurization, tension, shearing force, or wedge action; a method of applying ultrasonic waves; a heating method; a method of oxidizing porous Si to expand it from its circumference to subject it to an internal pressure; a method of pulse-heating to apply thermal stress or softening; or a method of inserting a fluid wedge such as a water jet. The present invention, however, is not limited to these methods. The porous layer may be formed by providing the two layers of the high- and low-porosity layers and then the multilayer structure can be separated by cracking the high-porosity layer 22 near its interface with the low-porosity layer.

Figure 6H:
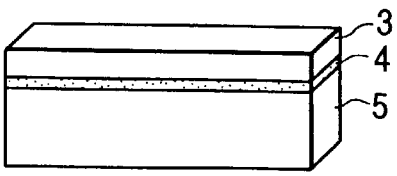

Subsequently, the porous layer 21 remaining on the surface of the nonporous layer 3 is removed by etching (FIG. 6H). The method for etching the porous layer is similar to that described above. When the porous silicon layer 21 remaining on the nonporous layer 3 is very and uniformly thin, the porous layer need not be etched.

Subsequently, this structure is thermally treated in a hydrogen containing reducing atmosphere to reduce the boron concentration of the nonporous single-crystal silicon layer 3 and flatten its surface. When the region of a high boron concentration in the single-crystal silicon layer is limited to the vicinity of the surface or when the reduction of the boron concentration is not required, polishing may be used to remove the surface layer, thereby flattening the surface.

Thus, the flat and uniformly thin single-crystal Si film 3 having a large area over the entire wafer is formed on the second member 5 via the insulating layer 4. The SOI substrate obtained in this manner can be preferably used to produce isolated electronic devices.

When the porous layer 22 remaining on the separated Si base material 1 is unnecessary, it is removed. When the surface is rough and the surface flatness is unacceptable, the surface is flattened and then the flattened silicon base material 1 can be used again as a new silicon base material 1 or as the second member 5. By forming the porous layer having a two-layer configuration and reducing the thickness of the high-porosity layer, the porous layer does not scarcely remain on the silicon base material 1. Accordingly, the surface can be smoothed by a heat treatment in a hydrogen containing reducing atmosphere without executing a removal process using the polishing or etching of the porous layer on the surface of the silicon base material 1, so that the treated member can be used again as the first semiconductor base member.

A method for producing another semiconductor base member will be described with reference to FIGS. 7A to 7H.

Figure 7A:
FIGS. 7A, 7B, 7C, 7D, 7E, 7F, 7G and 7H are schematically cross-sectional views for showing the method of producing a semiconductor base member according to the present invention.

As shown in FIG. 7A, a silicon base material 1 having no step-terrace structure is prepared.

Figure 7B:
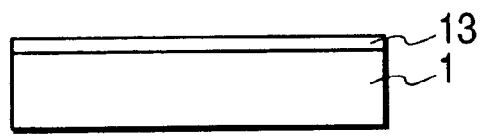

As shown in FIG. 7B, epitaxial growth processing is applied to the surface of the silicon base material to form an epitaxial layer 13 having a surface comprising the step-terrace structure.

Figure 7C:
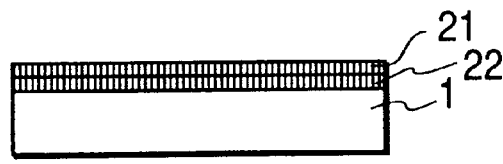

The surface is cleaned under conditions so that the step-terrace structure on the surface is not eliminated, and the major surface having steps and terraces is made porous (FIG. 7C). A porous Si layer can be formed by anodizing the Si base material in an HF solution.

By previously modulating the resistivity and electroconductivity type of a portion to be made porous, the porosity can be varied based on the modulated resistivity and conductivity type.

Thus, a low-porosity layer 21 is formed in a portion of the epitaxial silicon layer close to the surface, whereas a high-porosity layer 22 is formed in a portion of the silicon base material which is a non-degenerate substrate.

Figure 7D:
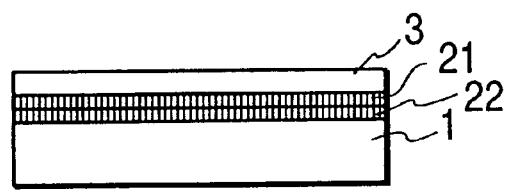
Figure 7E:
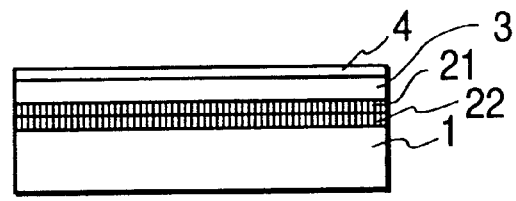

At least one nonporous single-crystal semiconductor layer 3 is formed on the porous layer 21 of a low porosity (FIG. 7D). The nonporous single-crystal semiconductor layer 3 is desirably formed after the surface of the porous silicon layer has been thermally treated in a hydrogen containing reducing atmosphere to seal the pores in the porous surface. The pores can be effectively sealed by executing a heat treatment in which the surface of the porous silicon is opposed to a member comprising a material not containing oxygen as a main component such as silicon, SiC or SiN to restrain the etching of silicon. Furthermore, as shown in FIG. 7E, a silicon oxide layer 4 is formed on the single-crystal Si layer by thermal oxidation.

Figure 7F:
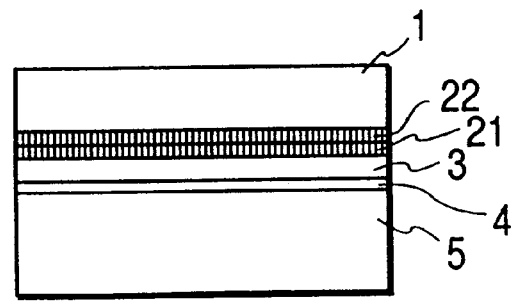

As shown in FIG. 7F, the major surface of the silicon base material 1 with the nonporous single-crystal Si layer 3 formed thereon is closely contacted with the surface of the second member 5 at the room temperature. Prior to the contact, the base material and the second member are desirably cleaned to remove attachments and foreign matter from the surface. Surfaces to be bonded are sufficiently flattened and smoothed.

Figure 7G:
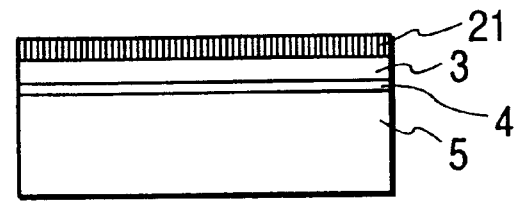

The silicon base material 1 is ground from its back surface and subjected to reactive ion etching to expose the porous layer as shown in FIG. 7G. Subsequently, the porous layer is removed to expose the nonporous single-crystal silicon layer 3.

The porous layer is desirably removed by means of selective etching with a mixed aqueous solution of HF and $H_2O_2$.

Subsequently, this structure is thermally treated in a hydrogen containing reducing atmosphere to reduce the boron concentration of the single-crystal silicon layer and flatten its surface. When the region of a high boron concentration in the single-crystal silicon layer is limited to the vicinity of the surface or when the reduction of the boron concentration is not required, polishing may be used to remove the surface layer, thereby flattening the surface.

Figure 7H:
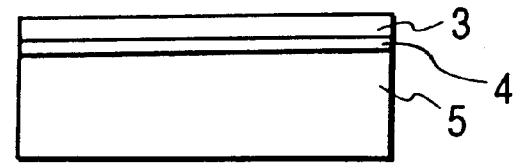

Thus, as shown in FIG. 7H, the flat and uniformly thin single-crystal Si film 3 is formed on the second member 5 via the insulating layer 4.

EXAMPLE 1

A boron-doped 8-inch (100) Si wafer having a resistivity of 0.015 Ωcm was installed in a vertical heat treatment furnace and thermally treated in a hydrogen atmosphere at 1100° for one hour. The Si wafer was then cooled in a hydrogen atmosphere and taken out from the furnace at 600° C. When the surface of the wafer taken out was observed with an atomic force microscope, a step-terrace structure having an interval of about 200 nm between atom steps was observed. This surface was anodized in a solution of hydrofluoric acid of 49 wt. % HF concentration and ethyl alcohol mixed at the ratio of 2:1 to form a porous silicon having a thickness of 10 μm on a wafer surface.

Subsequently, the wafer was thermally treated in a dry oxygen atmosphere at 400° C. for one hour to oxidize the side walls of the pores in the porous silicon layer and the surface of the porous silicon layer. The Si wafer with the porous silicon formed thereon was installed in an epitaxial growth apparatus and an epitaxial silicon layer was formed by using the CVD method under the following conditions.

Growth temperature: 900° C.
Growth pressure: 80 Torr
Gas species: $H_2$; 230 liter/min.
 $SiH_2Cl_2$; 0.4 liter/min.
Film thickness: 0.05 μm This sample was immersed in a mixture of HF and $H_2O_2$ for 30 minutes, and a Nomarski differential interference microscope was used to carefully observe the sample to find recessed regions at a frequency of one/cm² which were presumably formed when the HF—$H_2O_2$ mixture penetrated the epitaxial silicon layer to corrode the porous silicon layer.

On the other hand, when the Si wafer was not thermally treated in hydrogen prior to the formation of the porous layer (comparative sample), similar recessed regions were present at a frequency of two/cm². Thus, the quality of the epitaxial layer was improved by the heat treatment in hydrogen prior to the formation of the porous layer.

EXAMPLE 2

A boron-doped 8-inch (100) Si wafer having a resistivity of 0.015 Ωcm was installed in a commercially available leaf-to-leaf type epitaxial growth apparatus, and $SiH_2Cl_2$ added to a hydrogen gas was supplied to the apparatus to deposit a 10 μm-thick epitaxial silicon layer. When the surface of the wafer taken out from the apparatus was observed using an atomic force microscope, a step-terrace structure having an interval of about 200 nm between atom steps was observed. The SIMS method was used to measure the oxygen concentration of the epitaxial silicon layer as $5\times10^{17}$ cm$^{-3}$. This surface was anodized and made porous in a solution of hydrofluoric acid of 49 wt. % HF concentration and ethyl alcohol mixed at the ratio of 2:1 to form a porous silicon layer having a thickness of 5 μm on a wafer surface.

Subsequently, the wafer was thermally treated in a dry oxygen atmosphere at 300° C. for three hours to oxidize the side walls of the pores in the porous silicon layer and the surface of the porous silicon layer. This sample was immersed in an HF solution of 1.2 wt. % HF for 20 seconds and was then rinsed in a deionized water for 10 minutes.

After drying, this sample was installed in an epitaxial growth apparatus and an epitaxial silicon layer was formed by using the CVD method.

Growth temperature: 1040° C.
Growth pressure: 760 Torr
Gas species: $H_2$; 230 liter/min.
 $SiH_2Cl_2$; 0.4 liter/min.
Film thickness: 0.05 μm The sample was immersed in a mixture of HF and $H_2O_2$ for 30 minutes, and a Nomarski differential interference microscope was used to carefully observe the samples to find recessed regions at a frequency of 0.2/cm² which were presumably formed when the HF—$H_2O_2$ mixture penetrated the epitaxial silicon layer to corrode the porous silicon layer.

On the other hand, when the epitaxial growth was not carried out prior to the formation of the porous layer (comparative sample), similar recessed regions were present at a frequency of 2/cm². Thus, the quality of the epitaxial layer formed on the porous layer was improved by the heat treatment in hydrogen prior to the formation of the porous layer.

EXAMPLE 3

A boron-doped 8-inch (100) Si wafer having a resistivity of 10 Ωcm was installed in a commercially available leaf-to-leaf type epitaxial growth apparatus. $SiH_2Cl_2$ was introduced together with a hydrogen gas as a carrier gas, further $B_2H_6$ was added to the introduced gas, and the mixed gas was supplied to the apparatus to deposit a 0.5 μm-thick epitaxial silicon layer having a boron concentration of $3\times10^{18}$/cm³. When the surface of the wafer taken out from the apparatus was observed using an atomic force microscope, a step-terrace structure having an interval of about 200 nm between atom steps was observed. Furthermore, the wafer surface was anodized in a solution of hydrofluoric acid of 49 wt. % HF concentration and ethyl alcohol mixed at the ratio of 2:1 to form a porous silicon layer having a thickness of 10 μm on the surface. The silicon wafer was thermally treated in an oxidizing atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, such silicon wafers were installed in a vertical heat treatment furnace comprising a quartz furnace tube.

Figure 8:
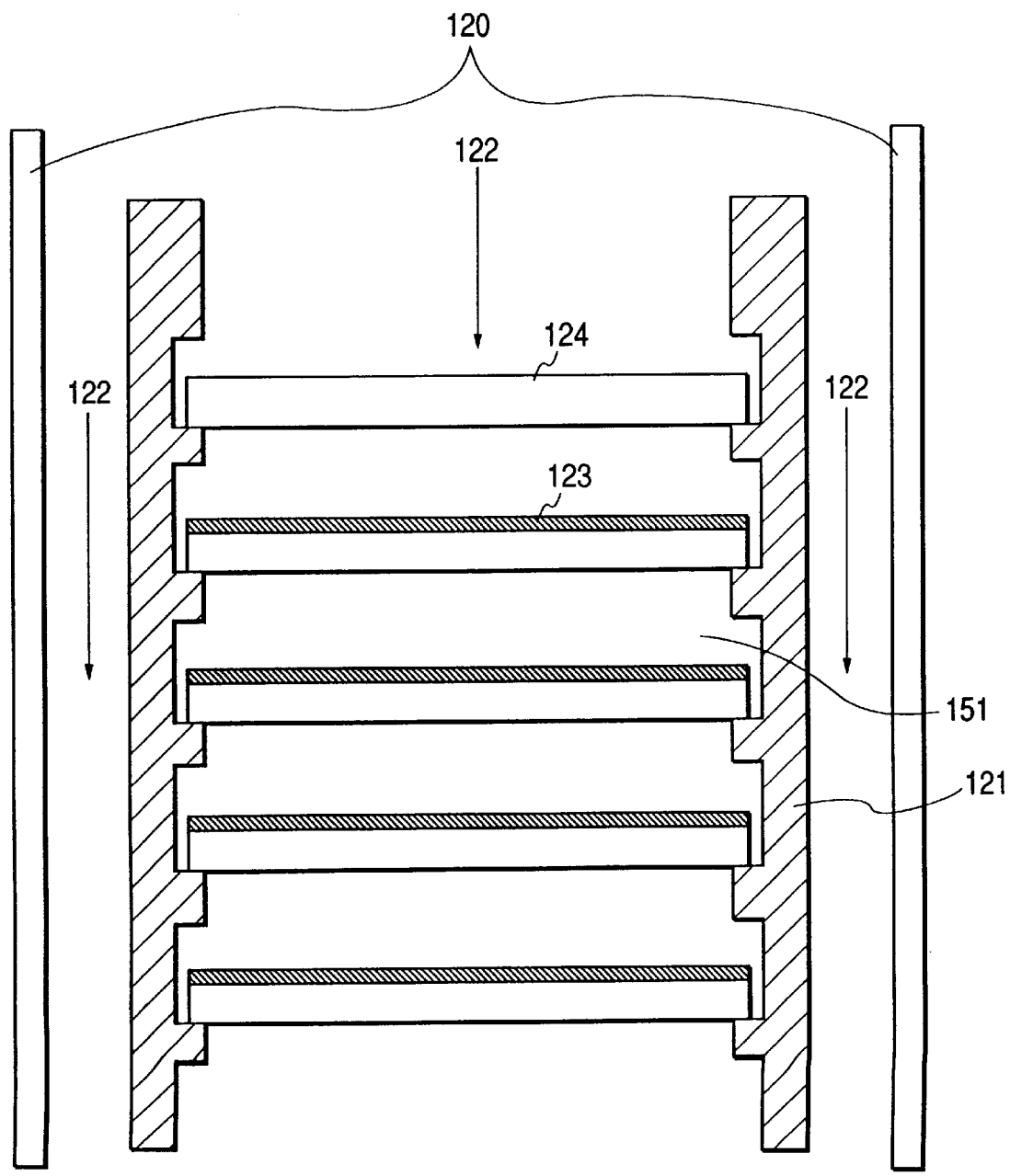
FIG. 8 is a schematically cross-sectional view for showing a vertical heat treatment furnace with silicon wafers installed therein.
Figure 9A:
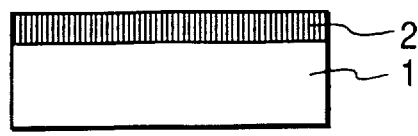
FIGS. 9A, 9B, 9C, 9D, 9E and 9F are schematically cross-sectional views for showing one example of a conventional method of producing a semiconductor base member.
Figure 9B:
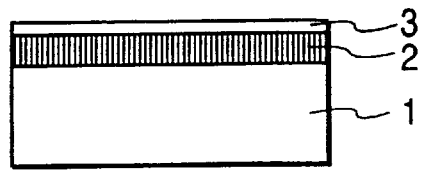
Figure 9C:
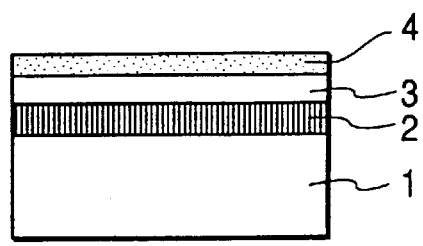
Figure 9D:
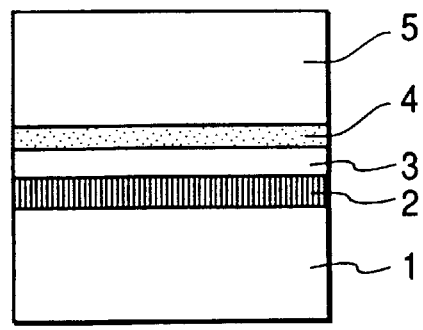
Figure 9E:
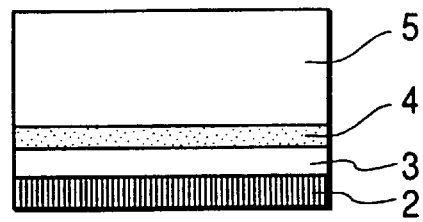
Figure 9F:
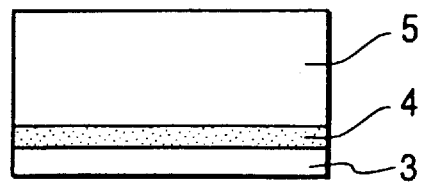

FIG. 8 shows a schematic sectional view showing for a vertical heat treatment furnace with silicon wafers installed therein. In FIG. 8, numeral 120 indicates a furnace tube of quartz, numeral 121 denotes a SiC boat on which a silicon wafer is loaded, and numeral 122 denotes an introduced gas. The furnace tube 120 is externally heated by a heater (not shown in the drawings). The gas 122 flows from the top of the furnace toward its bottom. As shown in FIG. 8, wafer 123 was installed on a SiC boat in the horizontal state and at an interval, generally denoted by numeral 151, of about 6 mm between the wafers such that the back surface of one silicon wafer was opposed to the surface of the porous layer of another silicon wafer and such that the center of the wafer was aligned with the center line of the furnace tube. As a dummy wafer, a commercially available silicon wafer 124 with no porous layer formed thereon was placed over the top silicon wafer with the porous layer formed thereon, at the same interval. The atmosphere in the furnace was replaced by hydrogen, and the temperature was increased up to 1150° C. and maintained for two hours. The temperature was then reduced again and the wafers were taken out from the furnace. Then, the surface of the wafer having the porous layer formed thereon was observed using an electron microscope to find no residual pores.

These wafers were installed in an epitaxial growth apparatus and a single-crystal silicon layer was formed under the following conditions.

Growth temperature: 1080° C.
Growth pressure: 760 Torr
Gas species: $H_2$; 230 liter/min.
$SiH_2Cl_2$; 0.4 liter/min.
Film thickness: 2 μm These samples were subjected to the defect manifestation etching and then observed using an optical microscope to find that the stacking defect density was $3 \times 10^3/cm^2$.

On the other hand, when the epitaxial silicon layer was not formed prior to the formation of the porous layer (comparative sample), the stacking defect density was $1.2 \times 10^4/cm^2$.

EXAMPLE 4

A boron-doped 8-inch (100) Si wafer having a resistivity of 0.015 Ωcm was installed in a vertical heat treatment furnace and thermally treated in a hydrogen atmosphere at 1100° C. for one hour. The temperature was reduced in the hydrogen atmosphere, and the wafers were taken out from furnace at 600° C. When the surface of the wafer taken out was observed using an atomic force microscope, a step-terrace structure having an interval of about 200 nm between atom steps was observed. In addition, by using a secondary ion mass spectrometer (SIMS) to measure the depth direction distribution of the boron concentration, the boron concentration was $5 \times 10^{18}/cm^3$ from the surface down to a depth of 5 μm. Furthermore, the wafer surface was anodized in a solution of hydrofluoric acid of 49 wt. % HF concentration and ethyl alcohol mixed at the ratio of 2:1 to form a porous silicon layer having a thickness of 10 μm on the surface. The silicon wafer was thermally treated in an oxygen atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, such silicon wafers were installed in a vertical heat treatment furnace comprising a quartz furnace tube. A gas flowed from the top of the furnace toward its bottom. As shown in FIG. 8, the wafers were installed on a SiC boat in the horizontal state and at an interval of about 6 mm between the wafers such that the back surface of one silicon wafer was opposed to the surface of the porous layer of another silicon wafer and such that the center of the wafer was aligned with the center line of the furnace tube. A commercially available silicon wafer with no porous layer formed thereon was placed over the top silicon wafer with the porous layer formed thereon, at the same interval. The atmosphere in the furnace was replaced by hydrogen, and the temperature was increased up to 1150° C. and maintained for two hours.

The temperature was then reduced again and the wafers were taken out from the furnace. Then, the surface of the wafer having the porous layer formed thereon was observed using an electron microscope to find no residual pores.

EXAMPLE 5

A boron-doped 8-inch (100) Si wafer having a resistivity of 0.015 Ωcm was installed in a vertical heat treatment furnace and thermally treated in a hydrogen atmosphere at 1100° C. for one hour. The temperature was reduced in the hydrogen atmosphere, and the wafers were taken out from the furnace at 600° C. When the surface of the wafer taken out was observed using an atomic force microscope, a step-terrace structure having an interval of about 200 nm between atom steps was observed. In addition, by using a secondary ion mass spectrometer to measure the depth direction distribution of the boron concentration, the boron concentration was $3 \times 10^{18}/cm^3$ from the surface down to a depth of 5 gum. Furthermore, the wafer surface was anodized in a solution of hydrofluoric acid of 49 wt. % HF concentration and ethyl alcohol mixed at the ratio of 2:1 to form a porous silicon layer having a thickness of 10 μm on the surface. The silicon wafer was thermally treated in an oxygen atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, such wafers were installed in a leaf-to-leaf type epitaxial growth apparatus. $SiH_2Cl_2$ was introduced to the apparatus together with $H_2$ as a carrier gas to deposit a 2 μm-thick epitaxial silicon layer at 900° C. and 80 Torr. These samples were as subjected to the defect manifestation etching and then observed using an optical microscope to find that the crystal defect density was $2 \times 10^2/cm^2$.

EXAMPLE 6

A boron-doped 8-inch (100) Si wafer having a resistivity of 0.015 Ωcm was installed in a commercially available leaf-to-leaf type epitaxial growth apparatus, and $SiH_2Cl_2$ added to a hydrogen gas was supplied to the apparatus to deposit a 0.5 μm-thick epitaxial silicon layer. The wafer was then installed in a vertical heat treatment furnace and thermally treated therein at 1100° C. for two hours. When the surface of the wafer taken out from the furnace was observed using an atomic force microscope, a step-terrace structure having an interval of 200 nm between atom steps was observed. In addition, by using a secondary ion mass spectrometer to measure the depth direction distribution of the boron concentration, the boron concentration was $5 \times 10^{18}/cm^3$ from the surface down to a depth of 5 μm. Furthermore, the wafer surface was anodized in a solution of hydrofluoric acid of 49 wt. % HF concentration and ethyl alcohol mixed at the ratio of 2:1 to form a porous silicon layer having a thickness of 10 μm on the surface. The silicon wafer was thermally treated in an oxygen atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, the wafer was installed in a leaf-to-leaf type epitaxial growth apparatus. $SiH_2Cl_2$ was introduced to the apparatus together with $H_2$ as a carrier gas to deposit a single-crystal silicon film having an average thickness of 310 nm +5 nm at 900° C. and 80 Torr. The silicon wafer was installed in an oxidation furnace, and a combustion gas of oxygen and hydrogen was used to oxidize the surface of the single-crystal silicon film to form a 200 nm-thick silicon oxide film. By this oxidation, the thickness of the single-crystal silicon film became 210 nm. This silicon wafer and a second silicon wafer were subjected to wet cleaning, which is generally used for silicon device processes, to form clean surfaces and were then bonded together. The set of bonded silicon wafers were installed in a heat treatment furnace and thermally treated therein at 1100° for one hour to enhance the adhesion strength of the bonded surfaces. The temperature was increased in a mixture of nitrogen and oxygen, and this heat treatment atmosphere was replaced by oxygen and then by a combustion gas of oxygen and hydrogen, which was maintained at 1100° C. for one hour, followed by the reduction of the temperature in a nitrogen atmosphere. The back surface of the first silicon wafer of the set of silicon wafers was ground to expose the porous silicon. The ground wafer was immersed in a mixed solution of HF and hydrogen peroxide to remove the porous silicon by means of etching, and was fully cleaned by wet cleaning. The single-crystal silicon film was transferred to the second silicon wafer together with the silicon oxide film to produce an SOI wafer. When the film thickness of the transferred single-crystal silicon was measured at in-plane 10-mm lattice points, the average film thickness was 210 nm with a variation of ±7 nm. In addition, when an atomic force microscope was used to measure the surface roughness within a 1-μm and a 50-μm squares at 256×256 measuring points, the surface roughness was 10.1 nm and 9.8 nm in terms of mean square roughness (Rrms), respectively. In addition, when the boron concentration was measured by secondary ion mass spectrometry, the boron concentration of the single-crystal silicon film was $1.2 \times 10^{18}$ g/cm$^3$. The silicon oxide film on the back surface of each SOI wafer was removed by etching with hydrofluoric acid, and then the wafers were installed in a vertical heat treatment furnace. A gas flowed from the top of the furnace toward its bottom. The wafers were installed on a SiC boat in the horizontal state and at an interval of about 6 mm between the wafers such that the back surface of one SOI wafer was opposed to the SOI layer surface of another SOI wafer and such that the center of the wafer was aligned with the center line of the furnace tube. A commercially available silicon wafer as a dummy wafer was placed over the top SOI wafer at the same interval. The atmosphere in the furnace was replaced by hydrogen, and the temperature was increased up to 1100° C. and maintained for four hours. The temperature was then reduced again and the wafers were taken out from the furnace.

After the heat treatment, the surface roughness of the single-crystal silicon film was measured using an atomic force microscope. When the porous layer was opposed to silicon to seal its pores, the mean square roughness (Rrms) was 0.11 nm in a 1-μm square and 0.35 nm in a 50-μm square, which indicate that the surface was as smooth as that of commercially available silicon wafers.

After the heat treatment, the boron concentration of the single-crystal silicon film was also measured using secondary ion mass spectrometry. It was found that the boron concentrations in the measuring positions were reduced to $5 \times 10^{15}$/cm$^3$ or less, and this range is a level at which devices can be produced appropriately.

EXAMPLE 7

A p-type 8-inch (100) dummy Si wafer having a resistivity of 10 Ωcm was installed in a commercially available leaf-to-leaf type epitaxial growth apparatus, and $SiH_2Cl_2$ and $B_2H_6$ added to a hydrogen gas were supplied to the apparatus to deposit a 0.5 μm-thick epitaxial silicon layer. When the surface of the wafer taken out from the apparatus was observed using an atomic force microscope, a step-terrace structure having an interval of about 200 nm between atom steps was observed. In addition, by using a secondary ion mass spectrometer to measure the depth direction distribution of the boron concentration, the boron concentration was $5 \times 10^{18}$/cm$^3$ from the surface down to a depth of 0.5 μm. Furthermore, the wafer surface was anodized in a solution of hydrofluoric acid of 49 wt. % HF concentration and ethyl alcohol mixed at the ratio of 2:1 to form a porous silicon layer having a thickness of 0.7 μm on the surface. A scanning electron microscope was used and the cross section of the formed porous silicon layer was observed to find that a low-porosity layer was formed from the surface to a depth of 0.5 μm in the surface layer and that a high-porosity layer was formed under the low-porosity layer down to a depth of 0.2 μm therefrom. The silicon wafer was thermally treated in an oxygen atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, the wafer was installed in a leaf-to-leaf type epitaxial growth apparatus and baked in a $H_2$ atmosphere at 1100° C. for one minute. Then, $SiH_2Cl_2$ was introduced into a $H_2$ carrier gas, and as a silicon source gas, dichlorosilane or silane was added to the hydrogen atmosphere at 900° C. to form a single-crystal silicon film having an average thickness of 310 nm±4 nm on the porous silicon. The silicon wafer was taken out from the epitaxial growth apparatus and installed in an oxidation furnace, in which a combustion gas of oxygen and hydrogen was used to oxidize the surface of the single-crystal silicon film, thereby forming a 200 nm-thick silicon oxide film. By this oxidation, the thickness of the single-crystal silicon film became 210 nm. This silicon wafer and a second silicon wafer having a 200 nm-thick silicon oxide film formed on the entire surface by thermal oxidation were each subjected to wet cleaning, which is generally used for silicon device processes, to form clean surfaces and were then bonded together. The set of bonded silicon wafers were installed in a heat treatment furnace and thermally treated therein at 1100° C. for one hour to enhance the adhesion strength of the bonded surfaces. The temperature was increased in a mixture of nitrogen and oxygen, and this heat treatment atmosphere was replaced by oxygen and then by a combustion gas of oxygen and hydrogen, which was maintained at 1100° C. for one hour, followed by the reduction of the temperature in a nitrogen atmosphere. When a water jet was injected against the set of silicon wafers from their side, the action of a fluid wedge separates the set of silicon wafers at the high-porosity porous layer to expose the porous layer. The separated wafer of the second silicon wafer side was immersed in a mixed solution of hydrofluoric acid and hydrogen peroxide to remove the porous silicon by etching, and was fully cleaned by wet cleaning. The single-crystal silicon film was transferred to the second silicon wafer together with the silicon oxide film to produce an SOI wafer. When the film thickness of the transferred single-crystal silicon was measured at in-plane 10-mm lattice points, the average film thickness was 210 nm with a variation of ±5 nm. In addition, when an atomic force microscope was used to measure the surface roughness within a 1-μm square and a 50-μm square at 256×256 measuring points, the surface roughness was 10.1 nm and 9.8 nm in terms of mean square roughness (Rrms), respectively. In addition, when the boron concentration was measured by secondary ion mass spectrometry, the boron concentration of the single-crystal silicon film was $1.2\times10^{18}/cm^3$. The silicon oxide film on the back surface of each SOI wafer was removed by etching with hydrofluoric acid, and then the SOI wafers were installed in a vertical heat treatment furnace comprising a quartz furnace tube. A gas flowed from the top of the furnace toward its bottom. As shown in FIG. 8, the wafers were installed on a SiC boat in the horizontal state and at an interval of about 6.3 mm between the wafers such that the back surface of one SOI wafer was opposed to the SOI layer surface of another SOI wafer and such that the center of the wafer was aligned with the center line of the furnace tube. A commercially available silicon wafer as a dummy wafer was placed over the top SOI wafer at the same interval.

The atmosphere in the furnace was replaced by hydrogen, and the temperature was increased up to 1100° C. and maintained for four hours. The temperature was then reduced again and the wafers were taken out from the furnace. The film thickness of the SOI layer was measured again. The amount of decrease in the film thickness of the SOI wafer was 1 nm or less in all the wafers.

After the heat treatment, the surface roughness of the single-crystal silicon film was measured using an atomic force microscope. The mean square roughness (Rrms) was 0.12 nm in a 1-μm square and 0.34 nm in a 50-μm square, which indicate that the surface was as smooth as that of commercially available silicon wafers. After the heat treatment, the boron concentration of the single-crystal silicon film was also measured using secondary ion mass spectrometry. It was found that the boron concentration was reduced to $5\times10^{15}/cm^3$ or less, which is a level at which devices can be produced appropriately.

The porous silicon remaining on the surface of the separated first silicon wafer was removed by etching, and such wafers were installed in a vertical heat treatment furnace comprising a quartz furnace tube. A gas flowed from the top of the furnace toward its bottom. As shown in FIG. 8, the wafers were installed on a SiC boat in the horizontal state and at an interval of about 6 mm between the wafers such that the back surface of one wafer was opposed to the surface of another wafer and such that the center of the wafer was aligned with the center line of the furnace tube. A commercially available silicon wafer as a dummy wafer was placed over the top wafer at the same interval. The atmosphere in the furnace was replaced by hydrogen, and the temperature was increased up to 1100° C. and maintained for four hours. The temperature was then reduced again and the wafers were taken out from the furnace.

After the heat treatment, the surface roughness of the single-crystal silicon film was measured using an atomic force microscope. The mean square roughness (Rrms) was 0.12 nm in a 1-μm square and 0.34 nm in a 50-μm square, which indicate that the surface was as smooth as that of commercially available silicon wafers. In addition, the wafer surface was irradiated with white light and scattered light was visually observed to find no patterns such as swirls. When these wafers were used as the first silicon wafers to be subjected to the above processing, SOI wafers could be similarly produced. Similar results were obtained by using a (100) Si p⁻ dummy substrate as the first substrate.

EXAMPLE 8

An 8-inch (100) n⁻ dummy Si wafer was installed in a commercially available leaf-to-leaf type epitaxial growth apparatus, and $SiH_2Cl_2$ and $PH_3$ added to a hydrogen gas were supplied to the apparatus to deposit a 0.3 μm-thick epitaxial silicon layer. When the surface of the wafer taken out from the apparatus was observed using an atomic force microscope, a step-terrace structure having an interval of about 200 nm between atom steps was observed. In addition, by using a secondary ion mass spectrometer to measure the depth direction distribution of the phosphorus concentration, the phosphorus concentration was $2\times10^{18}/cm^3$ from the surface down to a depth of 0.3 μm. Furthermore, while the wafer surface was irradiated with light, the wafer surface was anodized in a solution of hydrofluoric acid of 49 wt. % HF concentration and ethyl alcohol mixed at the ratio of 2:1 to form a porous silicon layer having a thickness of 1 μm on the surface. A scanning electron microscope was used and the cross section of the formed porous silicon wafer was observed to find that a low-porosity layer was formed from the surface to a depth of 0.3 μm in the surface layer and that a high-porosity layer was formed under the low-porosity layer down to a depth of 0.7 μm therefrom. The silicon wafer was thermally treated in an oxygen atmosphere at 400° C. for one hour and was then immersed in an HF solution of 1.25 wt. % HF for 20 seconds to remove a very thin oxide film formed on the surface of the porous layer and near it. The wafer was then fully cleaned with water and dried. Subsequently, the wafer was installed in a leaf-to-leaf type epitaxial growth apparatus and baked in a $H_2$ atmosphere at 1000° C. for one minute. Then, $SiH_2Cl_2$ was introduced into a $H_2$ carrier gas, and as a silicon source gas, dichlorosilane or silane was added to the hydrogen atmosphere at 900° C. to form a single-crystal silicon film having an average thickness of 310 nm±4 nm on the porous silicon. The silicon wafer was taken out from the epitaxial growth apparatus and installed in an oxidation furnace, in which a combustion gas of oxygen and hydrogen was used to oxidize the surface of the single-crystal silicon film to form a 200 nm-thick silicon oxide film. By this oxidation, the thickness of the single-crystal silicon film became 210 nm. This silicon wafer and a second silicon wafer having a 200 nm-thick silicon oxide film formed on the entire surface by thermal oxidation were subjected to wet cleaning, which is generally used for silicon device processes, to form clean surfaces and were then bonded together. The set of bonded silicon wafers were installed in a heat treatment furnace and thermally treated therein at 1100° for one hour to enhance the adhesion strength of the bonded surfaces. The temperature was increased in a mixture of nitrogen and oxygen, and this heat treatment atmosphere was replaced by oxygen and then by a combustion gas of oxygen and hydrogen, this state was maintained at 1100° C. for one hour, followed by the reduction of-the temperature in a nitrogen atmosphere. When a water jet was injected against the set of silicon wafers from their side, the action of a fluid wedge separated the set of silicon wafers at the high-porosity porous layer to expose the porous layer. The separated wafer of the second silicon wafer side was immersed in a mixed solution of hydrofluoric acid and hydrogen peroxide to remove the porous silicon by etching, and was fully washed by wet cleaning. The single-crystal silicon film was transferred to the second silicon wafer together with the silicon oxide film to produce an SOI wafer. When the film thickness of the transferred single-crystal silicon was measured at in-plane 10-mm lattice points, the average film thickness was 210 nm with a variation of ±5 nm. In addition, when an atomic force microscope was used to measure the surface roughness within a 1-μm square and a 50-μm square at 256×256 measuring points, the surface roughness was 10.1 nm and 9.8 nm in terms of mean square roughness (Rrms), respectively. In addition, when the boron concentration was measured by secondary ion mass spectrometry, the boron concentration of the single-crystal silicon film was $1.2 \times 10^{18}/cm^3$. The silicon oxide film on the back surface of each SOI wafer was removed by etching with hydrofluoric acid, and then SOI wafers were installed in a vertical heat treatment furnace comprising a quartz furnace tube. A gas flowed from the top of the furnace toward its bottom. As shown in FIG. 8, the wafers were installed on a SiC boat in the horizontal state at an interval of about 6.3 mm between the wafers such that the back surface of one SOI wafer was opposed to the SOI layer surface of another SOI wafer and such that the center of the wafer was aligned with the center line of the furnace tube. A commercially available silicon wafer as a dummy wafer was placed over the top SOI wafer at the same interval. The atmosphere in the furnace was replaced by hydrogen, and the temperature was increased up to 1100° C. and maintained for four hours. The temperature was then reduced again and the wafers were taken out from the furnace. The film thickness of the SOI layer was measured again. The amount of decrease in the film thickness of the SOI wafer was 1 nm or less in all the wafers.

After the heat treatment, the surface roughness of -the single-crystal silicon film was measured using an atomic force microscope. The mean square roughness (Rrms) was 0.12 nm in a 1-μm square and 0.34 nm in a 50-μm square, which indicate that the surface was as smooth as that of commercially available silicon wafers. After the heat treatment, the boron concentration of the single-crystal silicon film was also measured using secondary ion mass spectrometry. It was found that the boron concentration was reduced to $5 \times 10^{15}/cm^3$ or less, which is a level at which devices can be produced appropriately.

The porous silicon remaining on the surface of the separated first silicon wafer was removed by etching, and the etched wafers were installed in a vertical heat treatment furnace comprising a quartz furnace tube. A gas flowed from the top of the furnace toward its bottom. As shown in FIG. 8, the wafers were installed on a SiC boat in the horizontal state and at an interval of about 6 mm between the wafers such that the back surface of one wafer was opposed to the surface of another wafer and such that the center of the wafer was aligned with the center line of the furnace tube. A commercially available silicon wafer as a dummy wafer was placed over the top wafer at the same interval. The atmosphere in the furnace was replaced by hydrogen, and the temperature was increased up to 1100° C. and maintained for four hours. The temperature was then reduced again and the wafers were taken out from the furnace.

After the heat treatment, the surface roughness of the single-crystal silicon film was measured using an atomic force microscope. The mean square roughness (Rrms) was 0.12 nm in a 1-μm square and 0.34 nm in a 50-μm square, which indicate that the surface was as smooth as that of commercially available silicon wafers. In addition, the wafer surface was irradiated with white light and scattered light was visually observed to find no patterns such as swirls. When these wafers were used as the first silicon wafers to be subjected to the above processing, SOI wafers could be similarly produced.

EXAMPLE 9

A boron-doped 8-inch (100) Si wafer having a resistivity of 0.015 Ωcm was installed in a commercially available leaf-to-leaf type epitaxial growth apparatus, and $SiH_2Cl_2$ added to a hydrogen gas was supplied to the apparatus to deposit a 0.5 μm-thick epitaxial silicon layer. The wafer was then installed in a vertical heat treatment furnace and thermally treated therein at 1100° C. for two hours. When the surface of the wafer taken out from the apparatus was observed using an atomic force microscope, a step-terrace structure having an interval of about 200 nm between atom steps was observed. Furthermore, the wafer surface was anodized in a solution of hydrofluoric acid of 49 wt. % HF concentration and ethyl alcohol mixed at the ratio of 2:1 to form a porous silicon layer having a thickness of 10 μm on the surface. The silicon wafer was thermally treated in an oxygen atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, the wafer was installed in a leaf-to-leaf type epitaxial growth apparatus, and then $SiH_2Cl_2$ was introduced with $H_2$ as a carrier gas to the apparatus to deposit a single-crystal silicon film having an average thickness of 175 nm±3 nm at 900° C. and 80 Torr. The silicon wafer was installed in an oxidation furnace, and a combustion gas of oxygen and hydrogen was used to oxidize the surface of the single-crystal silicon film to form a 50 nm-thick silicon oxide film. This silicon wafer and a quartz substrate were subjected to wet cleaning, which is generally used for silicon device processes, and were then installed in a vacuum chamber, where they were exposed to $N_2$ plasma for one minute. Then, the wafers were taken out from the chamber, immersed in a deionized water for 10 minutes, and bonded together. Subsequently, the back surface side of the first silicon wafer of the set of bonded wafers was polished by 500 μm to make the first silicon wafer thinner. The bonded wafers were installed in a heat treatment furnace and thermally treated therein at 300° for 24 hours to enhance the adhesion strength of the bonded surfaces. The back surface of the silicon wafer of the set of the bonded wafers was polished again to expose the porous silicon. The set of the bonded wafers was installed in the heat treatment furnace again and thermally treated therein at 400° for one hour. The set was immersed in a mixed solution of hydrofluoric acid and hydrogen peroxide to remove the porous silicon by etching, and was fully cleaned by wet cleaning. The single-crystal silicon film was transferred to the second silicon wafer together with the silicon oxide film to produce an SOI wafer. The SOI wafer was further immersed in an alkali solution to etch the surface silicon layer so that the thickness of the SOI layer decreased to about 100 nm. When the film thickness of the transferred single-crystal silicon was measured at in-plane 10-mm lattice points, the average film thickness was 100 nm with a variation of ±3 nm. In addition, when an atomic force microscope was used to measure the surface roughness within a 1-μm square and a 50-μm square at 256×256 measuring points, the surface roughness was 10.1 nm and 9.8 nm in terms of mean square roughness (Rrms), respectively. Such SOI wafers were installed in a vertical heat treatment furnace. A gas flowed from the top of the furnace toward its bottom. The wafers were installed on a SiC boat in the horizontal state and at an interval of about 6 mm between the wafers such that the back surface of one SOI wafer was opposed to the SOI layer surface of another SOI wafer and such that the center of the wafer was aligned with the center line of the furnace tube.

A commercially available silicon wafer as a dummy wafer was placed over the top SOI wafer at the same interval. The atmosphere in the furnace was replaced by hydrogen, and the temperature was increased up to 970° C. and maintained for four hours. The temperature was then reduced again and the wafers were taken out from the furnace.

After the heat treatment, the surface roughness of the single-crystal silicon film was measured using an atomic force microscope. When the porous layer was opposed to silicon to seal the pores of the porous layer, the mean square roughness (Rrms) was 0.11 nm in a 1-$\mu$m square and 0.35 nm in a 50-$\mu$m square, which indicate that the surface was as smooth as that of commercially available silicon wafers.

After the heat treatment, the boron concentration of the single-crystal silicon film was also measured using secondary ion mass spectrometry. It was found that the boron concentration was reduced to $5 \times 10^{15}/cm^3$ or less, which is a level at which devices can be produced appropriately.

EXAMPLE 10

A boron-doped 5-inch (ill) Si wafer having a resistivity of 0.015 $\Omega$m was cleaned with a mixture of hydrochloric acid and hydrogen peroxide at 80° C. and was then immersed in a 40 wt. % $NH_4F$ solution for three seconds. Then, the wafer was immersed in a deionized water for three minutes. When the wafer surface was observed using an atomic force microscope, a step-terrace structure having an interval of about 200 nm between atom steps was observed. Furthermore, the wafer surface was anodized in a solution of hydrofluoric acid of 49 wt. % HF concentration and ethyl alcohol mixed at the ratio of 2:1 to form a porous silicon layer having a thickness of 10 $\mu$m on the surface. The silicon wafer was thermally treated in an oxygen atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, the silicon wafer was installed in a vertical heat treatment furnace comprising a quartz furnace tube. The atmosphere in the furnace was replaced by hydrogen, and the temperature was increased up to 1150° C. and maintained for two hours. The temperature was then reduced again and the wafers were taken out from the furnace. Then, the surface of the wafer having the porous layer formed thereon was observed using an electron microscope to find no residual pores.

The wafer was installed in an epitaxial growth apparatus and a single-crystal silicon layer was formed under the following conditions.

Growth temperature: 1080° C.

Growth pressure: 760 Torr

Gas species: $H_2$; 230 liter/min.

$SiH_2Cl_2$; 0.4 liter/min.

Film thickness: 2 $\mu$m

The sample was subjected to the defect manifestation etching and then observed using an optical microscope to find that the stacking defect density was $7 \times 10^3/cm^2$. On the other hand, when chemical treatment with ammonium fluoride was not carried out prior to the formation of the porous layer (comparative sample), the stacking defect density was $5 \times 10^4/cm^2$.

EXAMPLE 11

A p-type 8-inch (100) dummy Si wafer having a resistivity of 10 $\Omega$cm was installed in a commercially available leaf-to-leaf type epitaxial growth apparatus, and $SiH_2Cl_2$ and $B_2H_6$ added to a hydrogen gas were supplied to the apparatus to deposit a 0.5 $\mu$m-thick epitaxial silicon layer. When the surface of the wafer taken out from the apparatus was observed using an atomic force microscope, a step-terrace structure having an interval of about 200 nm between atom steps was observed. In addition, by using a secondary ion mass spectrometer to measure the depth direction distribution of the boron concentration, the boron concentration was $5 \times 10^{18}/cm^3$ from the surface down to a depth of 0.5 $\mu$m. The wafer was cleaned with a mixture of ammonia and hydrogen peroxide at 80° C. for 10 minutes and was rinsed in a deionized water for 10 minutes. It was then cleaned with an HF solution of 1.25 wt. % HF for 30 seconds, rinsed in a deionized water for 10 minutes, and dried using a spin dryer.

The amount of decrease in thickness by this cleaning was 4 nm, and the step-terrace structure was maintained. Furthermore, the wafer surface was anodized in a solution of hydrofluoric acid of 49 wt. % HF concentration and ethyl alcohol mixed at the ratio of 2:1 to form a porous silicon layer having a thickness of 0.7 $\mu$m on the surface. A scanning electron microscope was used and the cross section of the formed porous silicon layer was observed to find that a low-porosity layer was formed from the surface to a depth of 0.5 $\mu$m in the surface layer and that a high-porosity layer was formed under the low-porosity layer down to a depth of 0.2 $\mu$m therefrom. This silicon wafer was thermally treated in an oxygen atmosphere at 400° C. for one hour and was then immersed in an HF solution of 1.25 wt. % HF for 30 seconds to remove a very thin oxide film formed on the surface of the porous layer and near it. The wafer was then fully cleaned with water and dried. Subsequently, the wafer was installed in a leaf-to-leaf type epitaxial growth system and baked in a $H_2$ atmosphere at 950° C. and 600 Torr for one minute. Then, after the pressure had been reduced to 80 Torr, $SiH_2Cl_2$ was introduced, and a silicon source gas was added to the hydrogen atmosphere at 900° C. to form a single-crystal silicon film having an average thickness of 310 nm±4 nm on the porous silicon. The silicon wafer was taken out from the epitaxial growth apparatus and installed in an oxidation furnace, in which a combustion gas of oxygen and hydrogen was used and the surface of the single-crystal silicon film was oxidized to form a 200 nm-thick silicon oxide film. By this oxidation, the thickness of the single-crystal silicon film became 210 nm. This silicon wafer and a second silicon wafer having a 200 nm-thick silicon oxide film formed on the entire surface by thermal oxidation were each subjected to wet cleaning, which is generally used for silicon device processes, to form clean surfaces and were then bonded together. The set of bonded silicon wafers were installed in a heat treatment furnace and thermally treated therein at 1100° C. for one hour to enhance the adhesion strength of the bonded surfaces. The temperature was increased in a mixture of nitrogen and oxygen, and this heat treatment atmosphere was replaced by oxygen and then by a combustion gas of oxygen and hydrogen, which was maintained at 1100° C. for one hour, followed by the reduction of the temperature in a nitrogen atmosphere. When a water jet was injected against the set of silicon wafers from their side, the action of a fluid wedge separated the set of silicon wafers at the high-porosity porous layer to expose the porous layer. The separated wafer of the second silicon wafer side was immersed in a mixed solution of HF and hydrogen peroxide to remove the porous silicon by etching, and was fully cleaned by wet cleaning. The single-crystal silicon film was transferred to the second silicon wafer together with the silicon oxide film to produce an SOI wafer. When the film thickness of the transferred single-crystal silicon was measured at in-plane 10-mm lattice points, the average film thickness was 210 nm with a variation of ±5 nm. In addition, when an atomic force microscope was used to measure the surface roughness within a 1-$\mu$m square and a 50-$\mu$m square at 256×256 measuring points, the surface roughness was 10.1 nm and 9.8 nm in terms of mean square roughness (Rrms), respectively. In addition, when the boron concentration was measured by secondary ion mass spectrometry, the boron concentration of the single-crystal silicon film was $1.2 \times 10^{18}/cm^3$. The silicon oxide film on the back surface of each SOI wafer was removed by etching with hydrofluoric acid, and then the SOI wafers were installed in a vertical heat treatment furnace comprising a quartz furnace tube. A gas flowed from the top of the furnace toward its bottom. As shown in FIG. 8, the wafers were installed on a SiC boat in the horizontal state and at an interval of about 6.3 mm between the wafers such that the back surface of one SOI wafer was opposed to the SOI layer surface of another SOI wafer and such that the center of the wafer was aligned with the center line of the furnace tube. A commercially available silicon wafer as a dummy wafer was placed over the top SOI wafer at the same interval. The atmosphere in the furnace was replaced by hydrogen, and the temperature was increased up to 1100° C. and maintained for four hours. The temperature was then reduced again and the wafers were taken out from the furnace. The film thickness of the SOI layer was measured again. The amount of decrease in the film thickness of the SOI wafer was 1 nm or less in all the wafers.

After the heat treatment, the surface roughness of the single-crystal silicon film was measured using an atomic force microscope. The mean square roughness (Rrms) was 0.12 nm in a 1-$\mu$m square and 0.34 nm in a 50-$\mu$m square, which indicate that the surface was as smooth as that of commercially available silicon wafers. After the heat treatment, the boron concentration of the single-crystal silicon film was also measured using secondary ion mass spectrometry. It was found that the boron concentration was reduced to $5 \times 10^{15}/cm^3$ or less, which is a level at which devices can be produced appropriately.

The SOI wafers obtained were immersed in a mixture of $K_2Cr_2O_7$ and hydrofluoric acid and etched until the thickness of the SOI layer became 80 nm. Subsequently, the wafers were immersed in an HF 49 wt. % aqueous solution for three minutes. This allows all crystal defects in the SOI layer to be selectively etched to form pores that reach the embedded oxide film. When the wafers are subsequently immersed in hydrofluoric acid, the embedded oxide film under the pores is etched to enable easy observations using an optical microscope. In this example, the observed crystal defect density was $8 \times 10/cm^2$.

According to each of the above-described Examples, the pore size distribution of the porous silicon can be narrowed to improve crystallinity of the nonporous single-crystal semiconductor film formed on the porous silicon.

In addition, when the pores in the surface of the porous silicon are sealed by the heat treatment in a hydrogen containing reducing atmosphere, the pore sealing rate can be increased or the time required to seal the pores can be reduced. As a result, it is possible to improve the surface smoothness and crystallinity of the nonporous single-crystal semiconductor film formed on the porous silicon layer.

In addition, when the epitaxial silicon layer and the porous silicon are formed in this order, the surface layer of the semiconductor base member with the porous layer formed thereon contains no depletion that may become a COP, thereby contributing to further improving the crystallinity and surface property. Furthermore, when the $p^+$ epitaxial silicon layer and the porous silicon layer are formed in this order, an inexpensive dummy wafer can be selected as the semiconductor base member to reduce costs. Furthermore, when the high-concentration-doped epitaxial silicon layer is formed on the low-concentration substrate before the porous silicon layer is formed, then the low-porosity layer is formed on the high-concentration-doped epitaxial silicon layer, while the high-porosity layer is formed on the low-concentration substrate. Consequently, the nonporous single-crystal semiconductor film can be formed and bonded to the second member, and the resulting multilayer structure can be separated at the high-porosity layer to transfer the non-porosity single-crystal semiconductor film to the second member.

Furthermore, the epitaxial silicon layer can be formed on the separated dummy wafer for reuse. Besides, since most layers transferred to the second member have been formed by epitaxial growth, the amount of decrease in the film thickness of the dummy wafer is very small, and therefore the decrease in strength caused by the decrease in wafer thickness does not pose a problem in repeated reuse.

Furthermore, the separating surface is very smooth due to the alteration of the porous structure at the interface between the epitaxial layer and the substrate, and therefore the separated wafer is suitable for a surface smoothing treatment for reuse.

What is claimed is:

1. A method for producing a semiconductor base member, which comprises the steps of forming a surface comprising atom steps and terraces on a silicon base material, making the surface porous, and then forming a nonporous film thereon.

2. The method for producing a semiconductor base member according to claim 1, wherein the surface comprising atom steps and terraces is obtained by forming the atom steps and the terraces by a heat treatment in a hydrogen containing reducing atmosphere and then cleaning the surface under a condition of not eliminating the atom steps and terraces.

3. The method for producing a semiconductor base member according to claim 2, wherein the hydrogen containing reducing atmosphere contains 100% of hydrogen.

4. The method for producing a semiconductor base member according to claim 1, wherein the surface comprising atom steps and terraces is obtained by forming an epitaxial silicon layer to form the atom steps and the terraces and then cleaning the surface under a condition of not eliminating the atom steps and terraces.

5. The method for producing a semiconductor base member according to claim 4, wherein the epitaxial silicon layer is doped with an impurity to be converted to a p- or an n-type degenerate state.

6. The method for producing a semiconductor base member according to claim 1, wherein a silicon base material having a surface without atom steps and terraces is provided, the atom steps and terraces are formed on the surface, the surface is cleaned under a condition of not eliminating the atom steps and terraces, and the cleaned surface comprising the atom steps and the terraces is made porous.

7. The method for producing a semiconductor base member according to claim 1, wherein the surface comprising steps and terraces is obtained by forming the atom steps and the terraces by chemical cleaning or gas etching.

8. The method for producing a semiconductor base member according to claim 1, wherein an epitaxial silicon layer having an impurity concentration larger than that of the provided silicon base material is formed on the provided silicon base material to form the atom steps and terraces, the surface comprising the atom steps and the terraces is cleaned under a condition of not eliminating the atom steps and terraces, and then the epitaxial silicon layer and the surface of the silicon base material are made porous.

9. The method for producing a semiconductor base member according to claim 1, wherein the cycle of the atom steps is 200 nm or more.

10. The method for producing a semiconductor base member according to claim 1, further comprising the step of epitaxially growing the silicon base material containing an impurity and then thermally treating the base material to diffuse the impurity from the base material to the epitaxial layer.

11. A method for producing a semiconductor base member, which comprises: the step of forming a surface comprising atom steps and terraces on a silicon base material, making the surface porous to form a porous layer, and forming a nonporous semiconductor single-crystal film thereon to provide a first member; the step of bonding the first member and a second member together so as to obtain a multilayer structure with the nonporous semiconductor single-crystal film positioned inside; and the step of removing the porous layer from the multilayer structure.

12. The method for producing a semiconductor base member according to claim 11, wherein the surface comprising atom steps and terraces is obtained by forming the atom steps and the terraces by a heat treatment in a hydrogen containing reducing atmosphere and then cleaning the surface under a condition of not eliminating the atom steps and terraces.

13. The method for producing a semiconductor base member according to claim 12, wherein the hydrogen containing reducing atmosphere contains 100% of hydrogen.

14. The method for producing a semiconductor base member according to claim 11, wherein the surface comprising atom steps and terraces is obtained by forming an epitaxial silicon layer to form the atom steps and the terraces and then cleaning the surface under a condition of not eliminating the atom steps and terraces.

15. The method for producing a semiconductor base member according to claim 14, wherein the epitaxial silicon layer is doped with an impurity to be converted to a p- or an n-type degenerate state.

16. The method for producing a semiconductor base member according to claim 11, wherein a silicon base material having a surface without atom steps and terraces is provided, the atom steps and terraces are formed on the surface, the surface is cleaned under a condition of not eliminating the atom steps and terraces, and the cleaned surface comprising the atom steps and the terraces is made porous.

17. The method for producing a semiconductor base member according to claim 11, wherein the surface comprising steps and terraces is obtained by forming the atom steps and the terraces by chemical cleaning or gas etching.

18. The method for producing a semiconductor base member according to claim 11, wherein an epitaxial silicon layer having an impurity concentration larger than that of the provided silicon base material is formed on the provided silicon base material to form atom steps and terraces, the surface comprising the atom steps and terraces is cleaned under a condition of not eliminating the atom steps and terraces, and then the epitaxial silicon layer and the surface of the silicon base material are made porous.

19. The method for producing a semiconductor base member according to claim 11, wherein an interval between the atom steps is 200 nm or more.

20. The method for producing a semiconductor base member according to claim 11, further comprising the step of growing an epitaxial layer on the surface of the silicon base material containing an impurity and then thermally treating the surface to diffuse the impurity from the silicon base material to the epitaxial layer.

21. The method for producing a semiconductor base member according to claim 11, wherein an insulating film is formed on a surface to be bonded of at least one of the first and second members.

22. The method for producing a semiconductor base member according to claim 11, wherein the second member is an insulator.

23. The method for producing a semiconductor base member according to claim 11, wherein the step of removing the porous layer from the multilayer structure is carried out by removing the silicon base material not made porous and then removing the exposed porous layer.

24. The method for producing a semiconductor base member according to claim 23, wherein the silicon base material not made porous is removed by at least one of grinding, polishing, and etching.

25. The method for producing a semiconductor base member according to claim 23, wherein the multilayer structure is separated inside the porous layer and/or on an interface with the porous layer to remove the silicon base material not made porous.

26. The method for producing a semiconductor base member according to claim 11, wherein the entire silicon base material is made porous.

27. The method for producing a semiconductor base member according to claim 11, wherein the surface comprising atom steps and terraces is formed by depositing a $p^+$ epitaxial silicon layer on a $p^-$ or an $n^-$ silicon region or by depositing an $n^+$ epitaxial silicon layer on an $n^-$ silicon region, wherein the porous layer is formed so as to enter at least a part of the $p^-$ or $n^-$ silicon region, and wherein the multilayer structure is separated inside the porous layer in the $p^-$ or $n^-$ silicon region and/or on the interface between the region and the porous layer.

28. The method for producing a semiconductor base member according to claim 11, wherein the silicon base material separated in the separation step is used again as the silicon base material for the first member again.

29. The method for producing a semiconductor base member according to claim 11, wherein the silicon base material is a dummy grade silicon wafer.

30. The method for producing a semiconductor base member according to claim 11, wherein after making porous the surface of the silicon base material comprising atom steps and terraces, a heat treatment in a hydrogen containing reducing atmosphere is executed to seal the pores of the surface made porous.

31. The method for producing a semiconductor base member according to claim 11, wherein after making porous the surface of the silicon base material comprising atom steps and terraces, the surfaces of the side walls of the pores in the porous silicon and the surface of the porous silicon are oxidized.

32. The method for producing a semiconductor base member according to claim 11, wherein after making porous the surface of the silicon base material comprising atom steps and terraces, the surface of the side walls of the pores of the porous silicon and the surface of the porous silicon are oxidized, and then a heat treatment in a hydrogen containing reducing atmosphere is executed to seal the pores of the surface made porous.

33. The method for producing a semiconductor base member according to claim 11, wherein after oxidizing the surfaces of the side walls of the pores of the porous silicon and the surface of the porous silicon, an oxide film is peeled off from the surface of the porous silicon.

34. The method for producing a semiconductor base member according to claim 1, wherein the nonporous semiconductor single-crystal film comprises silicon.

35. The method for producing a semiconductor base member according to claim 11, wherein the nonporous semiconductor single-crystal film comprises silicon.

36. The method for producing a semiconductor base member according to claim 1, wherein the silicon base material is single-crystal silicon.

37. The method for producing a semiconductor base member according to claim 11, wherein the silicon base material is single-crystal silicon.

38. The method for producing a semiconductor base member according to claim 1, wherein the silicon base material is (100) single-crystal silicon.

39. The method for producing a semiconductor base member according to claim 11, wherein the silicon base material is (100) single-crystal silicon.

* * * * *

UNITED STATES PATENT AND TRADEMARK OFFICE
CERTIFICATE OF CORRECTION

PATENT NO. : 6,180,497 B1
DATED : January 30, 2001
INVENTOR(S) : Nobuhiko Sato et al.

It is certified that error appears in the above-identified patent and that said Letters Patent is hereby corrected as shown below:

Title page,
Item [56], Examiner, "Assistant Examiner-Asok Unmar Sarkar" should read -- Assistant Examiner-Asok K. Sarkar --.

Column 1,
Line 67, "is" should read -- are --.

Column 2,
Line 20, "1A, 1B, 1C, AND 1D" should read -- 1A to 1D --;
Line 30, "4A, 4B, 4C, 4D, 4E, 4F, 4G, 4H and 4I" should read -- 4A to 4I --;
Line 34, 5A, 5B, 5C, 5D, 5E and 5F" should read -- 5A to 5F --;
Line 38, "6A, 6B, 6C, 6D, 6E, 6F, 6G and 6H" should read -- 6A to 6H --;
Line 42, "7A, 7B, 7C, 7D, 7E, 7F, 7G and 7H" should read -- 7A to 7H --; and
Line 50, "9A, 9B, 9C, 9D, 9E and 9F" should read -- 9A to 9F --.

Column 3,
Line 9, "porous" should read -- a porous --;
Line 26, "distribution." should read -- distribution. In this --; and
Line 27, "¶ In this" should read -- In this --.

Column 4,
Line 7, "of" should read -- of the -- and "is" should read -- are --;
Line 18, "long" should read -- a long --; and
Line 19, "highly" should read -- high --.

Column 5,
Line 18, "surface" should read -- a surface --.

Column 6,
Line 48, "form" should read -- from --;
Line 59, "is" should read -- are --; and
Line 60, "When" should read -- As --.

Column 7,
Line 54, "$2.0 \times 10^{21}$/" should read -- $2.0 \times 10^{20}$/ --.

UNITED STATES PATENT AND TRADEMARK OFFICE
CERTIFICATE OF CORRECTION

PATENT NO. : 6,180,497 B1
DATED : January 30, 2001
INVENTOR(S) : Nobuhiko Sato et al.

It is certified that error appears in the above-identified patent and that said Letters Patent is hereby corrected as shown below:

Column 9,
Line 8, "surface." should read -- surface. Consequently, --;
Line 9, "¶ Consequently," should read -- Consequently, --;
Line 12, "oxide," should read -- the oxide, --;
Line 39, "conductor." should read -- conductor. Specifically, --; and
Line 40, "¶ Specifically," should read -- Specifically, --.

Column 10,
Line 1, "method" should read -- methods --.

Column 11,
Line 21, "does" should read -- is --.

Column 12,
Line 32, "sapphire" should read -- sapphire, --.

Column 13,
Line 62, "very and" should be deleted.

Column 19,
Line 17, "1100"" should read -- 1100°C. --;
Line 36, "1-µm" should read -- 1-µm square -- and "squares" should read -- square --; and
Line 41, "g/cm$^3$." should read -- /cm$^3$. --.

Column 22,
Line 52, "1100"" should read -- 1100°C. --;
Line 56, "hydrogen," should read -- hydrogen; --;
Line 58, "of-the" should read -- of the --.

Column 23,
Line 29, "-the" should read -- the --; and
Line 38, "5x10$^{15}$/cm$^3$" should read -- 5x10$^{15}$/cm$^3$ --.

Column 24,
Line 39, "300"" should read -- 300°C. --; and
Line 44, "400"" should read -- 400°C. --.

UNITED STATES PATENT AND TRADEMARK OFFICE
CERTIFICATE OF CORRECTION

PATENT NO. : 6,180,497 B1
DATED : January 30, 2001
INVENTOR(S) : Nobuhiko Sato et al.

It is certified that error appears in the above-identified patent and that said Letters Patent is hereby corrected as shown below:

Column 25,
Line 21, "(i11)" should read -- (111) --.

Signed and Sealed this

Fourth Day of December, 2001

Attest:

*Attesting Officer*

NICHOLAS P. GODICI
*Acting Director of the United States Patent and Trademark Office*